US007224246B2

(12) United States Patent
Thomas

(10) Patent No.: US 7,224,246 B2
(45) Date of Patent: May 29, 2007

(54) APPARATUS FOR STEERING AN ANTENNA SYSTEM

(75) Inventor: Louis David Thomas, Malvern (GB)

(73) Assignee: Quintel Technology Limited (GB)

( * ) Notice: Subject to any disclaimer, the term of this patent is extended or adjusted under 35 U.S.C. 154(b) by 158 days.

(21) Appl. No.: 10/491,179

(22) PCT Filed: Oct. 22, 2002

(86) PCT No.: PCT/GB02/04748

§ 371 (c)(1),
(2), (4) Date: Mar. 29, 2004

(87) PCT Pub. No.: WO03/036759

PCT Pub. Date: May 1, 2003

(65) Prior Publication Data

US 2004/0246175 A1 Dec. 9, 2004

(30) Foreign Application Priority Data

Oct. 22, 2001 (GB) ................................ 0125345.9

(51) Int. Cl.
*H01P 9/00* (2006.01)
*H01P 5/00* (2006.01)
*H03H 7/18* (2006.01)
*H01Q 3/26* (2006.01)

(52) U.S. Cl. ..................... 333/159; 333/24 C; 342/372

(58) Field of Classification Search ................ 342/372; 343/758, 765–766, 853; 359/290; 327/237; 333/159, 24 C See application file for complete search history.

(56) References Cited

U.S. PATENT DOCUMENTS

| | | | |
|---|---|---|---|
| 2,041,600 | A | 5/1936 | Friis |
| 2,239,775 | A | 4/1941 | Bruce |
| 2,245,660 | A | 6/1941 | Feldman et al. |
| 2,247,666 | A | 7/1941 | Potter |
| 2,961,620 | A | 11/1960 | Sommers |
| 3,277,481 | A | 10/1966 | Robin et al. |
| 3,522,558 | A | 8/1970 | Stafford et al. |
| 4,241,352 | A | 12/1980 | Alspaugh et al. |

(Continued)

FOREIGN PATENT DOCUMENTS

AU 38746/93 7/1993

(Continued)

OTHER PUBLICATIONS

Strickland, Peter "Microstrip Base Station Antennas for Cellular Communications", IEEE, pp. 166-171 (1991).

(Continued)

*Primary Examiner*—Thomas H. Tarcza
*Assistant Examiner*—Fred H. Mull
(74) *Attorney, Agent, or Firm*—McDonnell Boehnen Hulbert & Berghoff LLP

(57) ABSTRACT

An antenna system comprises an antenna assembly having an angle of electrical tilt and a plurality of antenna elements each arranged to receive signals through a respective transmission line. Each transmission line is shortened or lengthened by moving a coupling link along two transmission line parts which the link couples: this adjusts signal phase supplied to each antenna element individually, and controls the angle of electrical tilt of the antenna assembly.

35 Claims, 16 Drawing Sheets

U.S. PATENT DOCUMENTS

| | | | | |
|---|---|---|---|---|
| 4,249,181 | A | 2/1981 | Lee | |
| 4,788,515 | A | 11/1988 | Wong et al. | |
| 4,881,082 | A | 11/1989 | Graziano | |
| 5,281,974 | A | 1/1994 | Kuramoto et al. | |
| 5,691,987 | A | 11/1997 | Friederichs | |
| 5,825,762 | A | 10/1998 | Kamin, et al. | |
| 5,905,462 | A | 5/1999 | Hampel et al. | |
| 5,949,303 | A | 9/1999 | Arvidsson et al. | |
| 6,016,123 | A | 1/2000 | Barton et al. | |
| 6,097,267 | A | 8/2000 | Hampel | |
| 6,363,263 | B1 | 3/2002 | Reudink et al. | |
| 6,411,612 | B1 | 6/2002 | Halford | |
| 6,441,700 | B2 | 8/2002 | Xu | |
| 6,504,510 | B2 | 1/2003 | Kim | |
| 6,504,516 | B1 | 1/2003 | Davis | |
| 6,504,517 | B1 | 1/2003 | Liu et al. | |
| 6,529,166 | B2 | 3/2003 | Kanamarulu | |
| 6,573,875 | B2 | 6/2003 | Zimmerman | |
| 6,661,375 | B2 | 12/2003 | Rickett et al. | |
| 6,667,714 | B1 | 12/2003 | Solondz | |
| 6,690,325 | B1 * | 2/2004 | Zhou | 342/375 |
| 2003/0016097 | A1 * | 1/2003 | McKinzie et al. | 333/161 |
| 2005/0248494 | A1 * | 11/2005 | Davies | 343/757 |

FOREIGN PATENT DOCUMENTS

| | | |
|---|---|---|
| AU | 664625 | 11/1995 |
| AU | B-41625/93 | 11/1995 |
| EP | 0 575 808 | 12/1993 |
| EP | 0 531 090 | 3/2000 |
| GB | 1 314 693 | 4/1973 |
| JP | 61-006901 | 1/1986 |
| JP | 61-172411 | 8/1986 |
| JP | 02-174302 | 7/1990 |
| JP | 04-320121 | 11/1992 |
| JP | 04-320122 | 11/1992 |
| JP | 05-37222 | 2/1993 |
| JP | 5037222 | 2/1993 |
| JP | 05-075340 | 3/1993 |
| JP | 05-121902 | 5/1993 |
| JP | 05-121915 | 5/1993 |
| JP | 06-140985 | 5/1994 |
| JP | 06-196927 | 7/1994 |
| JP | 06-260823 | 9/1994 |
| JP | 6326501 | 11/1994 |
| JP | 10013103 | 1/1998 |
| WO | WO 89/07837 | 8/1989 |
| WO | WO 92/16061 | 9/1992 |
| WO | WO 93/15569 | 8/1993 |
| WO | WO 95/10862 | 4/1995 |
| WO | WO 01/24312 | 4/2001 |

OTHER PUBLICATIONS

Bacon, “Variable Elevation Beam-Aerial Systems for 1 ½Metres”, Journal IEE, pp. 539-544 (1946).

Forster, et al. “A Conical Beam Ship Array Antenna with Infinitely Variable Control of the Elevation Angle”, pp. 17-20 (1973).

Hansen, “Microwave Scanning Antennas” vol. 3 Array Systems, pp. 2-7 (1966).

Smith, textbook: “Circuits, Devices and Systems”, A First Course in Electrical Engineering, $4_{th}$ Ed., pp. 680-681 (1984).

Okuyama et al., “Base-Station Antenna Systems for Car and Handheld Cellular Phones”, Mitsubishi Denki Giho, vol. 68, No. 12, pp. 23-26 (1994).

Sumitomo Electric Technical Journal, No. 143, p. 136-139, Sep. 1993.

Brochure, “Brown Boveri Phaser for the Horizontal Slewing of Curtain Antennas”, Boveri & Cie AG, Mannheim, RFA Classif. n° 1601/242.

CEL-901 Cellular Antenna Controller User’s Manual, issued on Apr. 2, 1992, in the name of CAL Corporation (1991).

* cited by examiner

APPARATUS FOR STEERING AN ANTENNA SYSTEM

BACKGROUND OF THE INVENTION

1. Field of the Invention

The present invention relates to an improved apparatus for permitting steering of an antenna system and in particular to an apparatus for adjusting the phase of signals supplied to each element of an antenna system having a plurality of antenna elements. The antenna system is suitable for use in many telecommunications systems but finds particular application in cellular mobile radio networks, commonly referred to as mobile telephone networks.

2. Description of the Art

Operators of cellular mobile radio networks generally employ their own base-stations each of which includes one or more antennas. In a cellular mobile radio network, the antennas are a factor in defining the desired coverage area which is generally divided into a number of overlapping cells, each associated with a respective antenna and base station. Each cell contains a fixed-location base station which communicates with the mobile radios in that cell. The base stations themselves are interconnected by other means of communication, either fixed land-lines or by radio link, and are arranged in a grid or meshed structure allowing mobile radios throughout the cell coverage area to communicate with each other as well as with the public telephone network outside the cellular mobile radio network.

The antennas used in such networks are often composite devices known as phased array antennas which comprise a plurality (usually eight or more) or array of individual antenna elements or dipoles. The direction of maximum sensitivity of the antenna, i.e. the vertical or horizontal direction of the main beam or "boresight" of the antenna pattern, may be altered by adjusting the phase relationship between the sub-arrays. This has the effect of allowing the beam to be steered to modify the coverage area of the antenna.

In particular, operators of phased array antennas in cellular mobile radio networks have a requirement to adjust the vertical radiation pattern (VRP), also known as the "tilt", of the antenna since this has a significant effect on the coverage area of the antenna. Adjustment of the coverage area may be required, for example, owing to changes in the network structure or the addition or removal of other base stations or antennas in the cell.

The adjustment of the angle of tilt of an antenna is known and is conventionally achieved by mechanical means, electrical means, or both, within the antenna itself. When tilt is adjusted mechanically, for example by mechanically moving the antenna elements themselves or by mechanically moving the antenna radome, such an adjustment is often referred to as "adjustment of the angle of mechanical tilt". The effect of adjusting the angle of mechanical tilt is to reposition the boresight such that it points either above or below the horizon. When tilt is adjusted electrically, by adjusting the phase of signals supplied to the antenna elements without physically moving either the antenna radome or the antenna elements themselves, such an adjustment is commonly referred to as "adjustment of the angle of electrical tilt". The effect of adjusting the angle of electrical tilt is also to reposition the boresight so that it points either above or below the horizon but, in this case, is achieved by changing the time delay between signals fed to each element (or group of elements) in the array.

The elements in the antenna implementing controllable electrical tilt are normally grouped into sub-arrays, each sub-array comprising one or more elements. By changing the time delay of the signal fed to each sub-array, the electrical tilt of the beam may be adjusted. The time delay may be achieved by changing the phase of the RF carrier. Providing that the phase delay is proportional to frequency across the band of interest, and the phase response extrapolated to zero frequency has a zero intercept, then the phase delay produces a time delay. Phase shift and time delay are thus synonymous.

A disadvantage of this method, however, is that only relatively coarse adjustment of the time delay to each element of the antenna is possible resulting in a non-optimum gain and radiation pattern, particularly when tilted.

It is also known to provide an antenna which allows the time delay of the signal applied to each element in the array to be adjusted independently. A system which permits such independent adjustment of signals applied to individual antenna elements is described in U.S. Pat. No. 5,905,462.

SUMMARY OF THE INVENTION

A disadvantage of this type of system, however, is that the system necessarily includes a large number of moving parts, each of which must be moved in order to adjust the angle of electrical tilt. This can give rise to reliability problems.

According to one aspect of the present invention, there is provided an apparatus for adjusting the phase of signals supplied to each element of an antenna having a plurality of antenna elements, each element having a respective transmission line associated therewith, the apparatus comprising:

first supporting means having a plurality of said transmission lines disposed thereon; and second supporting means, movable relative to said first supporting means, having a plurality of coupling links disposed thereon;

wherein each of said coupling links comprises a length of transmission line arranged to capacitively couple with at least one of said transmission lines of said first supporting means such that movement of said second supporting means relative to said first supporting means alters the effective length of each of said transmission lines.

Conveniently, the first and second supporting means each comprise a respective board member on which the transmission lines or coupling links, respectively, are printed or otherwise disposed.

In one embodiment, the second board member, carrying the coupling links, is arranged to be substantially linearly movable relative to the first board member. In another embodiment, the second board member is arranged to be rotatable or angularly movable relative to the first board member.

Advantageously, movement of the second board member relative to the first board member changes the capacitive coupling between the coupling links and the transmission lines, thereby to alter the effective length of the transmission lines.

The apparatus may further comprise a dielectric substrate disposed on the first board member such that movement of the second board member relative to the first board member causes a greater or lesser portion of one or more of the coupling links to extend over the dielectric substrate, thereby to alter further the phase of signals on the transmission line.

In one embodiment, the dielectric substrate is disposed on the first board member in a position adjacent to the end of the transmission lines.

The apparatus may also include a ground plane disposed adjacent to the first board member.

In one embodiment, the ground plane is provided on a ground plane board member carrying the dielectric substrate and the first board member.

The apparatus may also include a second ground plane board member having a second ground plane, wherein the second board member is disposed between the first board member and the second ground plane board member.

In another embodiment, the transmission lines are disposed on a first surface of the first board member and a conductive ground plane is disposed on a second, opposing surface of the first board member.

A dielectric separator is preferably arranged between the first and second board members to facilitate capacitive coupling therebetween.

Each coupling link may preferably include one or more U-shaped lengths of transmission line.

In one embodiment, each of the transmission lines disposed on the first supporting means is substantially straight. In an alternative embodiment, each transmission line disposed on the first supporting means is of arcuate form.

The apparatus may include a series arrangement of coupling links and transmission lines for each of the elements. Alternatively a single transmission line may be associated with each of the elements.

In one embodiment, a transmission line associated with a first one of said elements is arranged radially outward of a transmission line associated with a second one of said elements.

Additionally, a coupling link associated with a first one of said elements is preferably arranged radially outward of a coupling link associated with a second one of said elements.

Preferably, the transmission lines and coupling links of the first and second supporting means respectively are arranged such that movement of the second supporting means relative to the first supporting means permits adjustment of the phase of signals supplied to each element by an amount different from the phase of signals supplied to at least one other element.

The apparatus may also include a splitter arrangement for distributing signals supplied on an input transmission line to transmission lines associated with two or more elements.

The apparatus may also include actuating means coupled to the second board member for effecting movement thereof relative to the first board member.

The actuating means may be an actuating arm driven by a servo control arrangement.

According to a further aspect of the invention, an antenna system comprises a plurality of antenna elements and an apparatus as described herein for adjusting the phase of signals supplied to each element of the antenna system.

Preferably, the antenna elements of the system may be mounted upon an antenna mast, the antenna system further comprising a control means for controlling the servo control arrangement, wherein the control means is located at a base of the antenna mast.

In an alternative embodiment, the system may include a control means for controlling the servo control arrangement, wherein the control means is located at a distant location from the antenna elements.

In one embodiment, said apparatus is arranged for independent adjustment of the phase of signals supplied to each of said antenna elements, thereby to enable phase adjustment for each element by a different amount, if required.

Alternatively, the apparatus may be arranged to adjust the phase of signals supplied to each of said antenna elements by the same amount. In one embodiment, the apparatus includes means for adjusting the phase of signals supplied to two or more elements by the same amount.

If the antenna system comprises a splitter arrangement for receiving an input signal and distributing the input signal to each of the antenna elements, the splitter arrangement may be arranged to distribute signal strength to each of said antenna elements in said antenna assembly substantially in a uniform distribution. The distribution of signal strength to each of the antenna elements is conveniently selected to set the boresight gain and the side lobes to an appropriate level.

The antenna elements may be arranged in at least first and second sub-arrays and the apparatus is arranged to adjust the phase of signals supplied to antenna elements in said first sub-array by a first amount and to adjust the phase of signals supplied to antenna elements in said second sub-array by a second amount. Conveniently, the first amount is equal in magnitude but opposite in polarity to said second amount.

For the purpose of this specification, reference to "individual control" of the phase of signals supplied to each element in the array is intended to mean that the signals passing through each transmission line to the associated element can be phase adjusted (if required), thereby to permit phase adjustment of signals to different antenna elements by different amounts, if required.

BRIEF DESCRIPTION OF THE DRAWINGS

The present invention will now be described, by way of example only, with reference to the accompanying drawings in which.

DETAILED DESCRIPTION OF THE INVENTION

In the following description, the invention is described in the context of an antenna system suitable for use in a cellular mobile radio network and particularly the Universal Mobile Telephone System (UTMS). However, it will be appreciated that the invention is not confined to such use and may be equally applicable to other communications systems.

Figure 1:
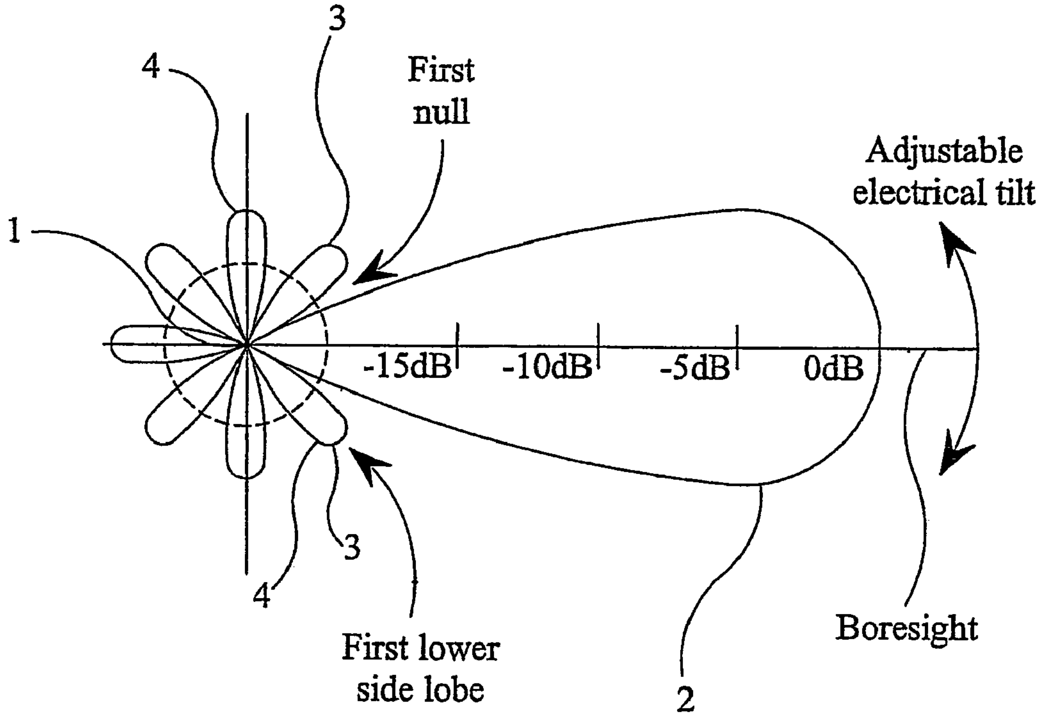
FIG 1 (Prior Art)
FIG. 1 illustrates the vertical radiation pattern (VRP) of a known phased array antenna assembly.

FIG. 1 shows the vertical radiation pattern (VRP) of a conventional phased array antenna assembly. The drawing is shown in side view and the antenna assembly is represented by the point 1.

The VRP of the antenna assembly 1 consists of a main lobe or "boresight" 2 which diverges in a vertical plane as it extends from the antenna assembly and represents the region of maximum radiation intensity of the beam radiated by the antenna assembly.

The VRP of the antenna assembly also includes a number of side lobes 4, representing regions of much lower radiation intensity, which extend from the antenna assembly in directions which are approximately equiangularly spaced about the antenna assembly in a vertical plane. The lobes 3 immediately adjacent the boresight 2 are termed the first upper and first lower side lobes respectively.

Figure 2:
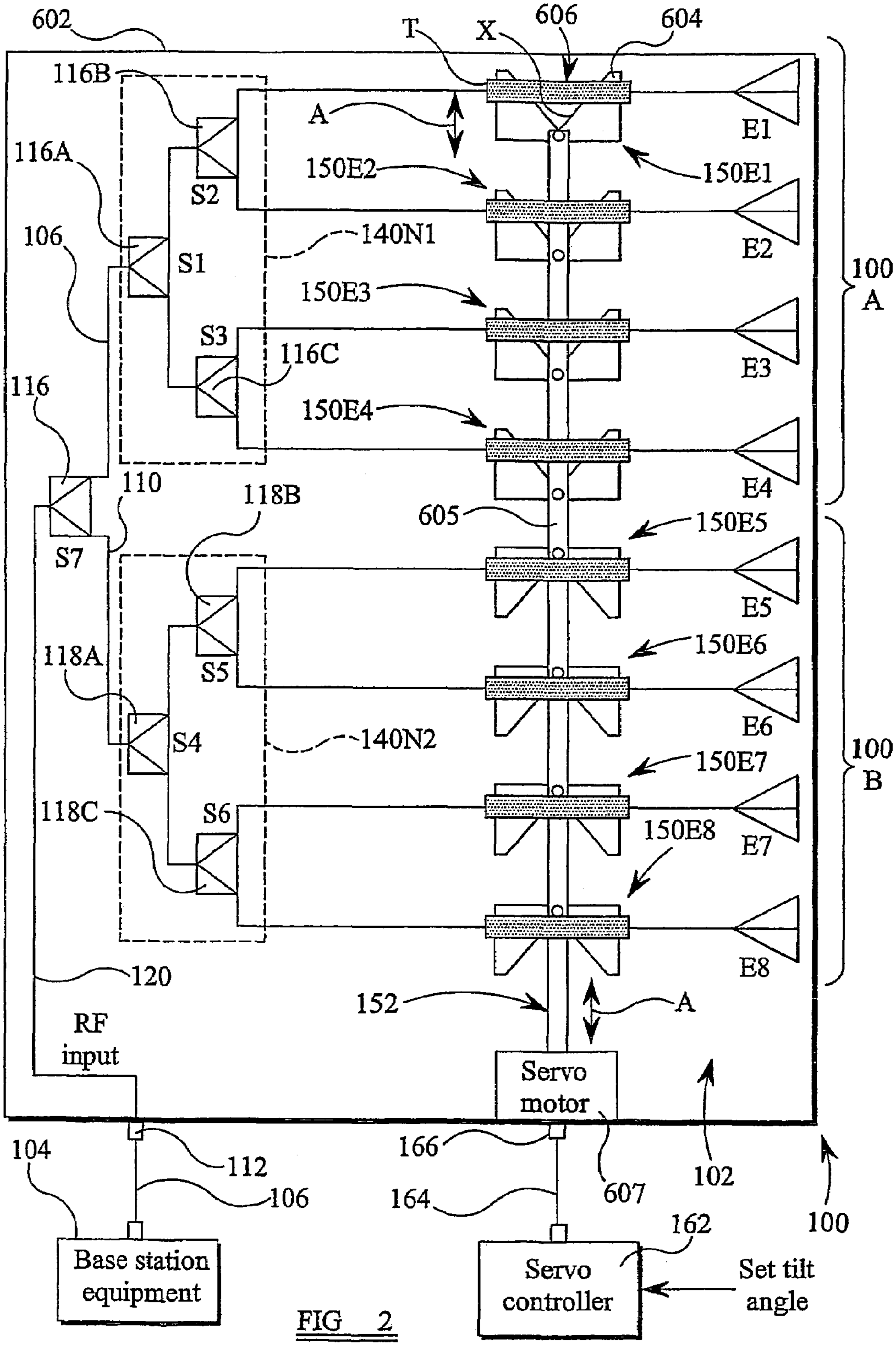
FIG 2 (Prior Art)
FIG. 2 is a schematic block diagram of an antenna assembly incorporating means for adjusting the angle of electrical tilt.

In FIG. 2, the antenna assembly of an antenna system incorporating a mechanism for adjusting the angle of electrical tilt of the antenna is shown schematically generally at 100. In this example, the antenna system 100 comprises an antenna assembly, shown at 102, comprising a phased array antenna having an array of eight elements E1 to E8 mounted upon an antenna mast (not shown). A control unit (not shown) for the antenna assembly 102 is located at a base-station 104 which may be located at the base of the antenna mast. The elements E1 to E8 are arranged into two sub-arrays, an upper sub-array 100A comprising elements E1 to E4 and a lower sub-array 100B comprising elements E5 to E8.

The antenna assembly 102 includes an input port, represented by 112, which is connected to the control unit in the base-station 104 via a feeder line 106. The input port 112 supplies an input carrier line 120 which is connected to a signal distribution network comprising a series of splitter units S1–S7 which are provided to distribute signals to each of the elements E1 to E8 in the array. Each splitter unit S1–S7 is of conventional form and has a single input and two outputs.

The input carrier line 120 is connected to the input of a primary splitter unit 116 (also identified as S7). The first output of the primary splitter unit 116 is connected to a first output carrier line 106 while the second output of the primary splitter unit 116 is connected to a second output carrier line 110.

The first output carrier line 106 is connected to an RF distribution network 140N1 including first, second and third upper sub-array splitter units, 116A, 116B, 116C respectively. The second output carrier line 110 is connected to a second RF distribution network 140N2 including first, second and third lower sub-array splitter units 118A, 118B, 118C respectively.

The first output carrier line 106 is connected to the input of the first upper sub-array splitter unit 116A whilst the second output carrier line 110 is connected to the input of the first lower sub-array splitter unit 118A. First and second outputs of the first upper sub-array splitter unit 116A are connected to the inputs of second and third upper sub-array splitter units 116B, 116C, respectively. Similarly, first and second outputs of the first lower sub-array splitter unit 118A are connected to the inputs of second and third lower sub-array splitter units 118B, 118C.

The antenna assembly 102 also includes phase adjustment means, in the form of a plurality of mechanical phase adjustment devices 150E1 to 150E8. Specifically, the outputs of the second upper sub-array splitter unit 116B are connected to the elements E1 and E2 respectively by respective phase adjustment devices 150E1, 150E2. The outputs of the third upper sub-array splitter unit 116C are connected to the elements E3 and E4 respectively by respective phase adjustment devices 150E3, 150E4. Similarly, the outputs of the second lower sub-array splitter unit 118B are connected to the elements E5 and E6 respectively by respective phase adjustment devices 150E5, 150E6, and the outputs of the third lower sub-array splitter unit 118C are connected to the elements E7 and E8 respectively by respective phase adjustment devices 150E7, 150E8.

The function of the phase adjustment devices 150E1–150E8 is to adjust the phase of the RF signal supplied to each antenna element by a predetermined amount. Each mechanical phase adjustment device is arranged to adjust the phase of signals on an associated transmission line T connected to a respective one of the antenna elements E1–E8. This adjustment of phase is achieved by linear movement of a movable member formed from dielectric material disposed beneath the transmission line and the amount or level of adjustment can be varied, as described below.

Each mechanical phase adjustment device 150E1–150E8 includes a base plate across which a transmission line T to the antenna element runs. In the illustrated embodiment, the base plate is formed by a support member 602 of the antenna assembly. The device also includes a generally planar member 604 of dielectric material which is disposed between the support member 602 and the transmission line T. The plate of dielectric material 604, termed a "wedge", is generally rectangular with a triangular or V-shaped segment 606 cut away from one longitudinal edge thereof.

The wedge 604 is movable relative to the base plate 602 and to the transmission line T in a direction (shown by arrow A) generally transverse to the transmission line T. Movement of the wedge 604 is effected by means of an actuating arm 152 driven by an actuator 607 such as a servo actuator. Owing to its shape, linear movement of the wedge 604 transverse to the transmission line T causes a greater or lesser amount of dielectric material to be interposed between the transmission line T and the base plate 602, thereby causing the phase of any signals on the transmission line T to be shifted by an amount which is dependent on the linear position of the wedge relative to the transmission line.

The amount of phase shift applied to the signal on the transmission line T is set by the position of the wedge 604 beneath the transmission line T, the "wedge angle" (the internal angle X of the V-shape cut into the wedge) and the electrical properties of the dielectric material forming the wedge.

The provision of a respective mechanical phase adjustment device for each antenna element E1–E8 permits adjustment of the phase of signals supplied to each individual element in the sub-arrays 100A, 100B.

In operation, the RF signal applied to the input port 112 on the antenna assembly 102 is applied, via the input the carrier line 120, to the primary splitter unit 116. Considering firstly the upper sub-array 100A having elements E1 to E4, the signal on the input carrier line 120 is split into two signals by the primary splitter unit 116 and is output on the first and second output carrier lines 106, 110. The signal on the first output carrier line 106, having a signal strength half that of the signal input to the primary splitter unit 116, is supplied to the input of the first upper sub-array splitter unit 116A which again splits the signal into two signals, each having a signal strength one quarter that of the signal on the input carrier line 120. Each of these two signals is supplied to the input of the second and third upper sub-array splitter units 116B, 116C, respectively.

The second and third upper sub-array splitter units 116B, 116C again split the signal supplied to their respective inputs and supply each of these signals, having a signal strength one eighth that of the signal on the input carrier line 120, to a respective one of the elements E1 to E4 in the upper sub array 100A via respective phase adjustment devices 150E1 to 150E4.

Similarly, in the lower sub-array 100B, the signal on the second output carrier line 110, having a signal strength half that of the signal input to the primary splitter unit 116, is supplied to the input of the first lower sub-array splitter unit 118A. The first lower sub-array splitter unit 118A splits the signal into two signals, each having a signal strength one quarter that of the signal on the input carrier line 120. Each of these two signals is supplied to the input of the second and third lower sub-array splitter units 118B, 118C, respectively.

The second and third lower sub-array splitter units 118B, 118C again split the signal supplied to their respective inputs and supply each of these signals, having a signal strength one eighth that of the signal on the input carrier line 120, to a respective one of the elements E5 to E8 in the lower sub array 100B via respective phase adjustment devices 150E5 to 150E8.

The phase adjustment devices 150E1 to 150E8 are arranged to apply a predetermined phase shift to the signals supplied to each of the elements E1 to E8. By providing an independent phase adjustment arrangement for each element in the antenna assembly, the distribution of phase across the antenna assembly can be accurately controlled. As such, the system allows more accurate control of the boresight gain and side lobe level.

Movement of the actuating arm 152 in the directions shown by the arrow A is achieved by means of a servo control mechanism 160 or the like which is controlled by a servo controller 162 in known manner. Control signals generated by the servo controller 162 for controlling the servo mechanism 160 are supplied to the latter via a control cable 164 and control port 166. The control cable can be of substantially any desired length, enabling the servo mechanism 160 to be controlled from a location remote from the antenna assembly, for example from the base-station 104 at the base of the antenna mast, or at a distant location, if desired, several kilometers away. The linear movement of the actuating arm 152 effects linear movement of the wedges in each phase adjustment arrangement and, hence, adjusts the phase of signals supplied to each of the elements in the manner described above.

It will be noted that the phase adjustment arrangements connected to the elements E5 to E8 in the lower sub-array 100B are reversed compared to those connected to the elements E1 to E4 in the upper sub-array 100A. Consequently, a negative phase shift applied to the signals supplied to the elements E1 to E4 in the upper sub-array will cause a positive phase shift to be applied to the signals supplied to the elements E5 to E8 in the lower sub-array 100B.

It will be appreciated that the "family tree" arrangement of the splitter units 116A–116C, 118A–118B allows signals of equal signal strength to be supplied to each of the elements in the upper sub-array 100A. In this arrangement, each of the elements will be supplied with a signal having a signal strength approximately one eighth the signal strength of the signal on the input carrier line 120. This configuration is appropriate since the individual phase adjustment of the signals supplied to antenna elements means that a proportionate signal strength distribution to the elements, such as a cosine squared distribution, is not required in order to provide maximum boresight gain relative to the level of the side lobes in the VRP.

The antenna of FIG. 2 suffers from a number of disadvantages. In particular, the mechanical phase adjustment devices may be inaccurate and phase adjustment of the signals supplied to the antenna elements may not be sufficiently precise. In addition, the complexity of the actuator arm arrangement and the number of moving parts required means that the system is prone to reliability problems.

FIGS. 3A to 3C illustrate an improved apparatus for adjusting the phase of signals supplied to the antenna elements. The apparatus, denoted as 30, is intended to replace a respective one of the mechanical phase adjustment devices 150E1 to 150E8 in FIG. 2.

The apparatus 30 comprises first supporting means in the form of a generally rectangular, planar board 32 on which is printed or otherwise disposed first and second substantially parallel conducting tracks 34*a*, 34*b*. In use, the tracks 34*a*, 34*b* form a portion of the transmission line, T, which is connected between one of the splitter units and a respective element of the antenna system. It will be appreciated, however, that the portion of transmission line defined by the tracks 34*a*, 34*b* is discontinuous.

The apparatus also comprises second supporting means in the form of a second, generally rectangular, planar board 36. The second board 36 has printed or otherwise disposed thereon a coupling link in the form of a U-shaped length of conducting track 38 and is disposed above and plane parallel with the first board 32. The arms of the U-shaped track 38 are arranged to lie above, and to capacitively couple with, a respective one of the first and second tracks 34*a*, 34*b*. In addition, the second board 36 is movable relative to the first board 32 in a direction denoted by the arrow A. Such movement of the second board 36 relative to the first board 32 changes the amount by which the arms of the coupling track 38 extend over the tracks 34*a*, 34*b* and hence changes the capacitive coupling therebetween. Thus, the effective length of the transmission line defined by the tracks 34*a*, 34*b* and the U-shaped track 38 capacitively coupled thereto can be varied by moving the second board 36.

For example, in FIG. 3*b*, the second board 36 is shown substantially at its leftmost position, in which the effective length of the transmission line defined by the tracks 34*a*, 34*b*, 38 is substantially at its shortest. On the other hand, in FIG. 3C, the second board 36 is shown substantially at its rightmost position in which the effective length of the transmission line defined by the tracks 34*a*, 34*b*, 38 is substantially at its longest. By varying the effective length of the transmission line T through movement of the second board 36 relative to the first board 32, variable amounts of delay can be added to the signal supplied to the antenna element. As such, a desired shift in phase of the signal can be achieved.

Figure 3:
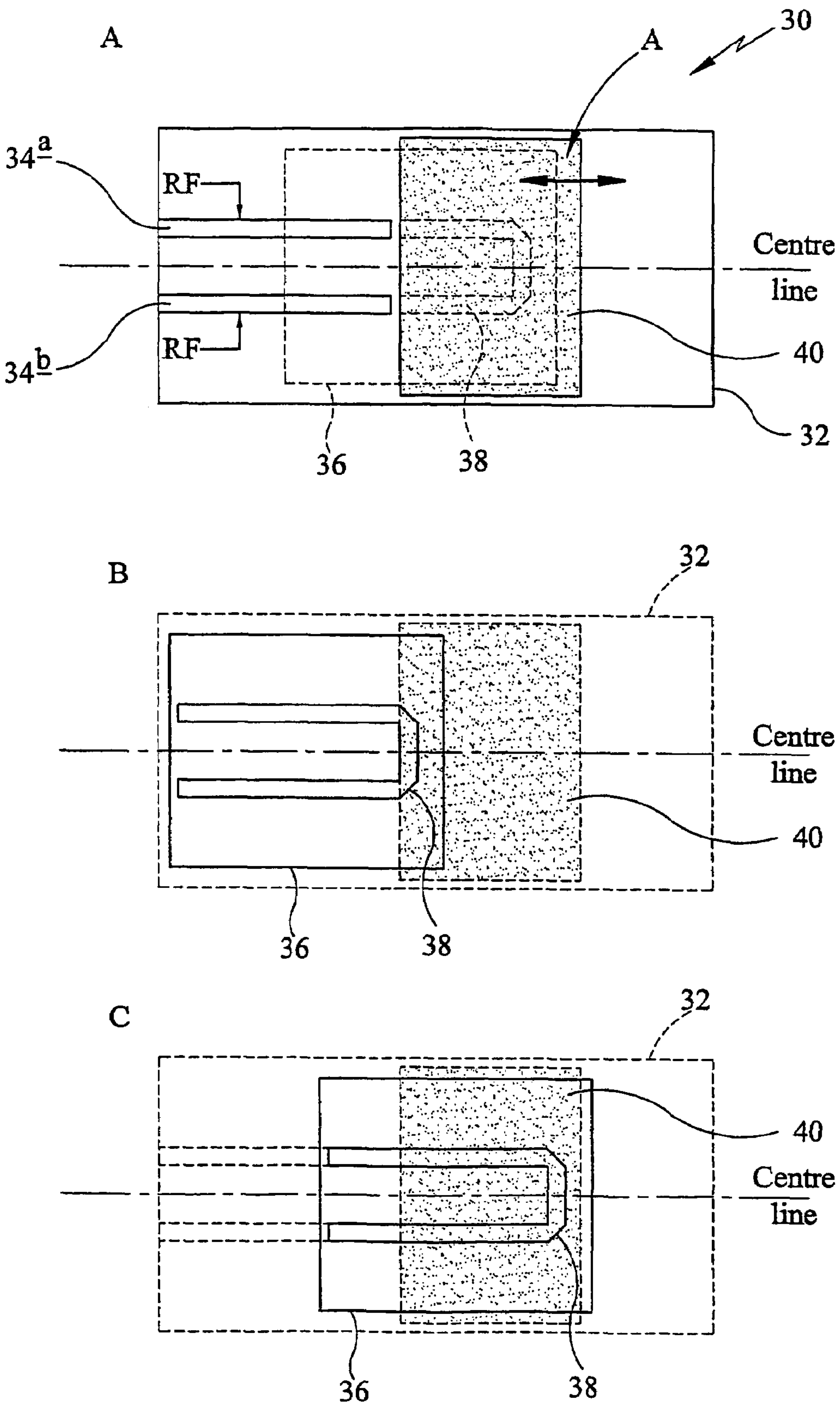
FIGS. 3A to 3C illustrate a first form of apparatus according to the invention for adjusting the phase of signals supplied to an element in an antenna array, and the operation thereof.

The apparatus of FIG. 3 additionally includes a generally planar dielectric substrate 40 which is disposed on, and generally plane parallel with, the first board 32, in a position adjacent to the ends of the first and second tracks 34*a*, 34*b*.

The dielectric substrate 40 preferably has a dielectric constant which is higher than that of the first and second boards 32, 36.

It will be understood that, in certain positions of the second board 36, the coupling link 38 extends over the dielectric substrate 40. By altering the amount by which the coupling link extends over the dielectric substrate 40, through movement of the second board 36 relative to the first board 32, a further adjustment in the phase of signals on the transmission line T can be achieved. The increased relative permittivity of the dielectric substrate 40 reduces the velocity of the signal on the transmission line T and thus adds an additional delay to the signal supplied to the associated antenna element. It will be appreciated, therefore, that the effect of the dielectric substrate 40 on the signal supplied on the transmission line T is similar to that achieved by the wedge member of the mechanical phase adjustment devices 150E1–150E8 shown in FIG. 2.

An advantage of the apparatus of FIG. 3 is that phase adjustment of signals on the transmission line is achieved by both the effective lengthening of the track 34*a*, 34*b*, 38 and the use of a dielectric substrate. As a result, it is possible to adjust the phase of a signal on the transmission line within a greater range and more accurately than with existing systems. Moreover, owing to the use of a U-shaped coupling track 38, movement of the second board 36 through a distance, d, results in a change in effective length of the transmission line of 2*d*, even without the use of the dielectric substrate 40. For example, a 10 mm movement of the second board will produce a change in effective length of the transmission line of 20 mm.

FIGS. 4A to 4D illustrate various practical implementations of the apparatus of FIG. 3. FIG. 4A illustrates a so-called micro-strip construction having first and second boards 32, 36 as described above. The first board 32 has a conductive ground plane 42 disposed on its surface opposite that on which the tracks 34*a*, 34*b* are disposed so as to form a transmission line with the tracks. In this embodiment, a dielectric substrate layer 40 is not present but a dielectric separator 43 is used between the first and second boards 32, 36 to facilitate capacitive coupling and to reduce interference from Inter-Modulation Products (IMPs) due to any intermittent Ohmic contact between the tracks 34*a*, 34*b* and the coupling link 38.

FIG. 4B illustrates a so-called tri-plate version of the apparatus. In this embodiment, the second board 36 is interposed between the first board 32 and an additional board 46 having a ground plane 48. Again, no dielectric substrate 40 is used. This embodiment provides the advantage that losses from the apparatus are reduced and the electromagnetic RF field is better contained.

FIG. 4C illustrates an apparatus similar to that of FIG. 4A but with the addition of the dielectric substrate layer 40 described above. In this embodiment, the ground plane 42 is provided on an additional board 50 which is used to support the first board 32 and the dielectric substrate layer 40.

FIG. 4D illustrates a tri-plate version of the apparatus of FIG. 4C. As in the case of the apparatus of FIG. 4B, an additional lower board 46 having a ground plane 48 is provided, the second board 36 being disposed intermediate the additional lower board 46 and the first board 32. Again, reduced losses and better containment of the RF field are achieved.

Figure 5:
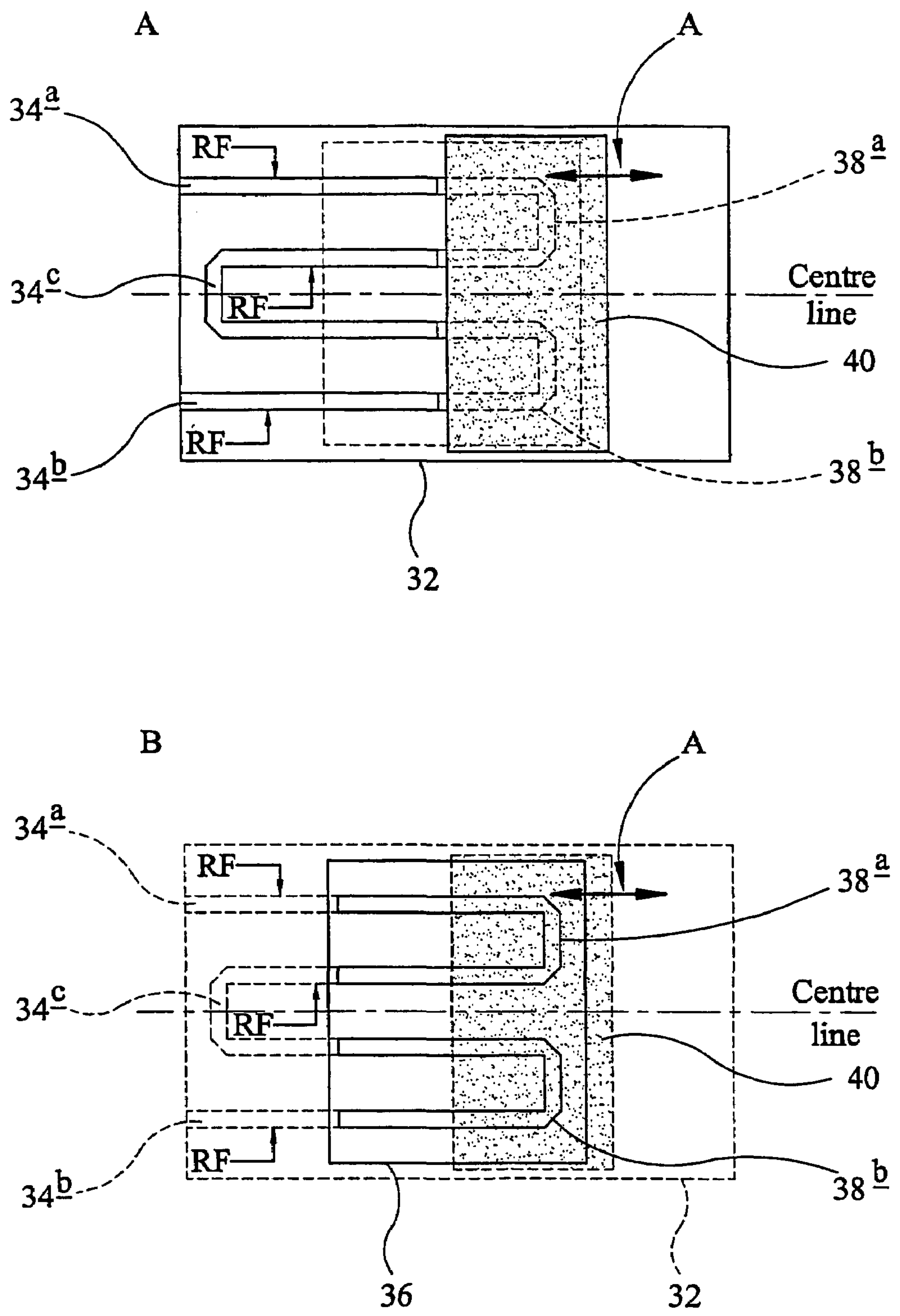
FIGS. 5A and 5B illustrate a modification to the apparatus of FIG. 3A, and operation thereof.

FIG. 5 illustrates a modification to the apparatus of FIG. 3. FIG. 5A shows a top plan view of the apparatus and FIG. 5B shows a bottom plan view. For some applications, it may be required to increase the range or amount of phase shift or delay which can be applied to signals on the transmission line T. This may be achieved by providing a third, intermediate conductive track 34*c* on the first board 32. The third track 34*c* is U-shaped and is disposed between the first and second conductive tracks 34*a*, 34*b* in a reverse orientation.

In this embodiment, the second board 36 has two coupling links or tracks, each in the form of a respective U-shaped track 38*a*, 38*b*, printed or otherwise disposed thereon. A first one of the coupling links 38*a* is arranged to capacitively couple with the first track 34*a* and one arm of the third track 38*c*. The second one of the coupling links 38*b* is arranged to capacitively couple with the second track 34*b* and the other arm of the third track 34*c*.

It will be appreciated that, in this embodiment, movement of the second board 36 relative to the first board 32 will result in a greater change in effective length of the transmission line T compared with the embodiment of FIG. 3. For example, a 10 mm movement of the second board 36 will produce a change in effective length of the transmission line of around 40 mm. This arrangement of two coupling links or tracks and three conductive tracks is hereafter referred to as a “series” arrangement.

Figure 4:
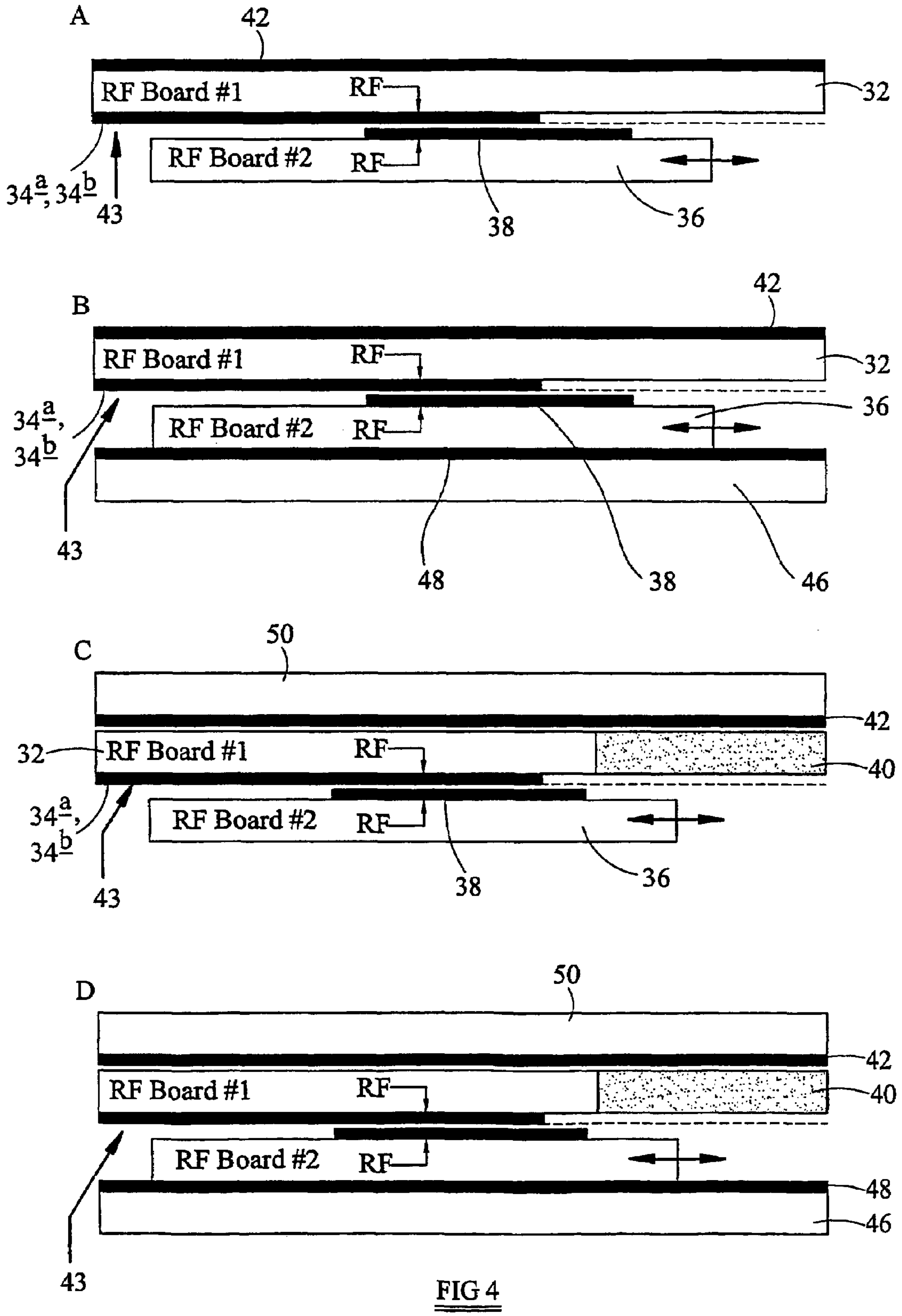
FIGS. 4A to 4D illustrate possible methods of construction of the apparatus of FIG. 3A.

In the embodiments of FIGS. 3 to 5, the apparatus is intended to be connected to a transmission line for a single antenna element. Thus, an antenna having a plurality of elements, such as a phased array antenna, will have a corresponding number of the apparatus of FIGS. 3 to 5, one for each element as in the prior art embodiment of FIG. 2. Whilst this arrangement certainly provides advantages over the prior art, such as improved accuracy of applied delay, it still requires that each apparatus be moved simultaneously in order to effect the required phase shift to the signals supplied to the elements. Clearly, this involves a number of moving parts which increases complexity and cost and reduces reliability.

Figure 6:
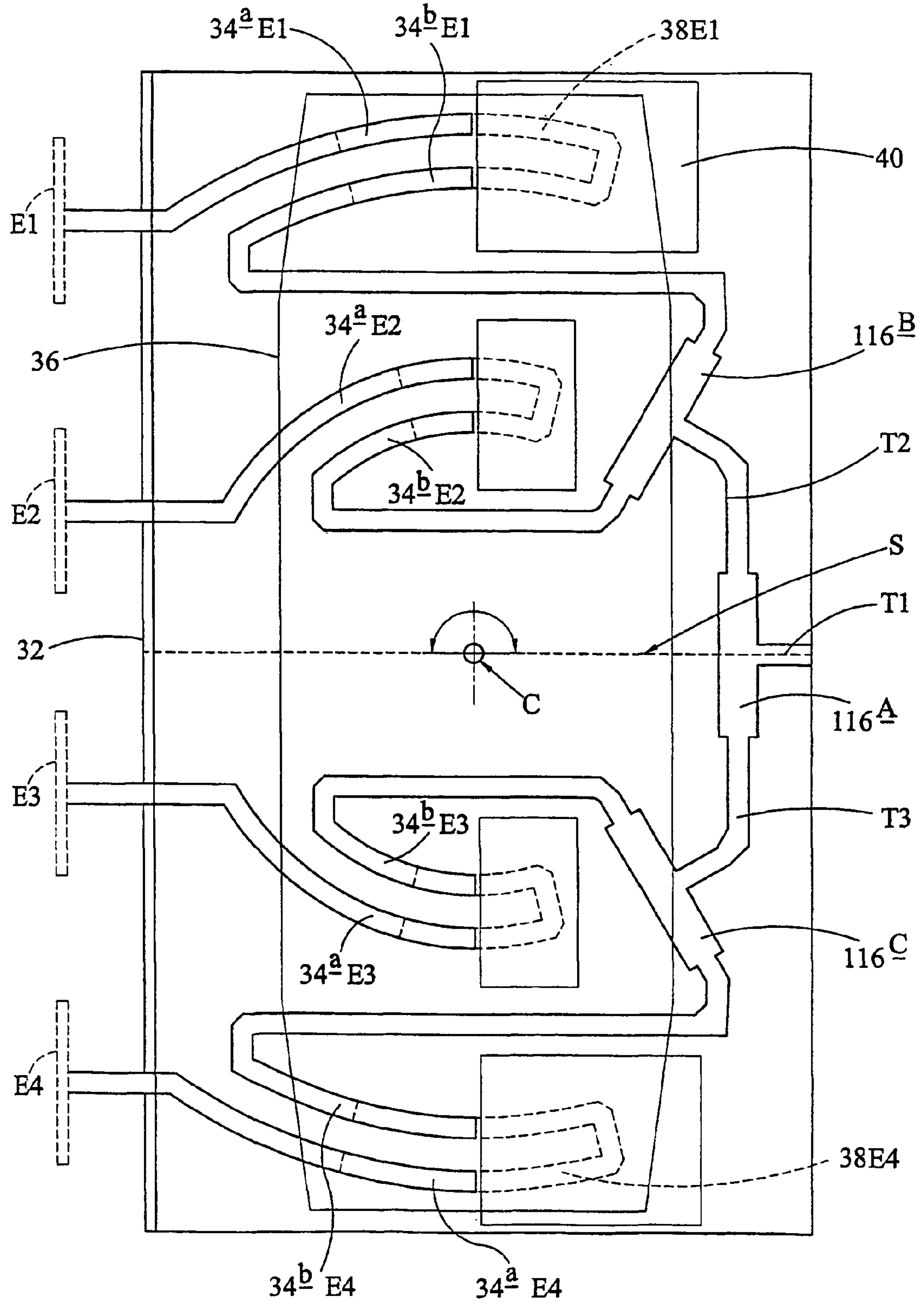
FIG. 6 is a schematic illustration of a second form of apparatus according to the invention.

FIG. 6 shows, schematically, an improvement to the apparatus of FIGS. 3 to 5 and permits use of the apparatus in antenna systems having a plurality of elements. In the embodiment of FIG. 6, the apparatus may be used in an antenna system having four antenna elements E1 to E4. Alternatively, the apparatus can be considered to replace the mechanical phase adjustment devices 150E1 to 150E4 in the antenna system of FIG. 2 and these reference numerals are used in FIG. 6 to indicate corresponding devices.

Thus, the embodiment of FIG. 6 consists of four phase adjustment devices, each having an arrangement of conductive tracks and coupling links which are similar in form and operation to the apparatus of FIG. 3.

In this improved embodiment, the first and second conductive tracks 34*a*, 34*b* of each device are printed or otherwise disposed on a common first board 32. However, rather than being straight tracks as in the apparatus of FIG. 3, the first and second tracks 34*a*, 34*b* of each device are arcuate in form, though still parallel. First and second tracks 34*a*E1, 34*b*E1 of the first device are disposed on a first half of the first board 32 at a region radially outward of the tracks of the second device. Likewise, the first and second tracks 34*a*E4, 34*b*E4 of the fourth device are disposed on a second half of the first board 32 at a region radially outward of the tracks of the third device.

A first track T1 extends from a first, “input” edge of the first board 32 to a first splitter unit 116A which may, for example, correspond to the splitter unit 116A of FIG. 2. Second and third tracks T2, T3 extend from the outputs of the first splitter unit 116A to inputs of respective second and third splitter units 116B, 116C which may, for example, correspond to the splitter units 116B, 116C respectively of FIG. 2.

From a first output of the second splitter unit, a track T4 extends to form, at a region adjacent to its free end, the second arcuate track 34*b*E1 for the first device which forms part of the transmission line T for the first antenna element E1. The first arcuate track 34*a*E1 for the first device is disposed radially outwardly of the second track 34*b*E1 and extends parallel thereto, again forming part of the transmission line T for the first antenna element E1.

A similar arrangement of tracks 34*a*E2, 34*b*E2, the latter extending from the second output of the second splitter unit 116B, is provided for the second device connected to the antenna element E2, this arrangement being provided radially inwardly of the first device and the tracks 34*a*E2, 34*b*E2 being somewhat shorter in length than those of the first device.

The first and second outputs of the third splitter unit 116C are connected to third and fourth devices, respectively, the third device being associated with and connected to the third antenna element E3 and the fourth being associated with and connected to the fourth antenna element E4. It can be seen that the arrangement of tracks and coupling links of the third and fourth devices are disposed on the first board 32 substantially symmetrically relative to those of the first and second devices, about a line of symmetry S extending between a midpoint of the input edge of the first board and a midpoint of the opposite, output edge thereof.

Figure 7:
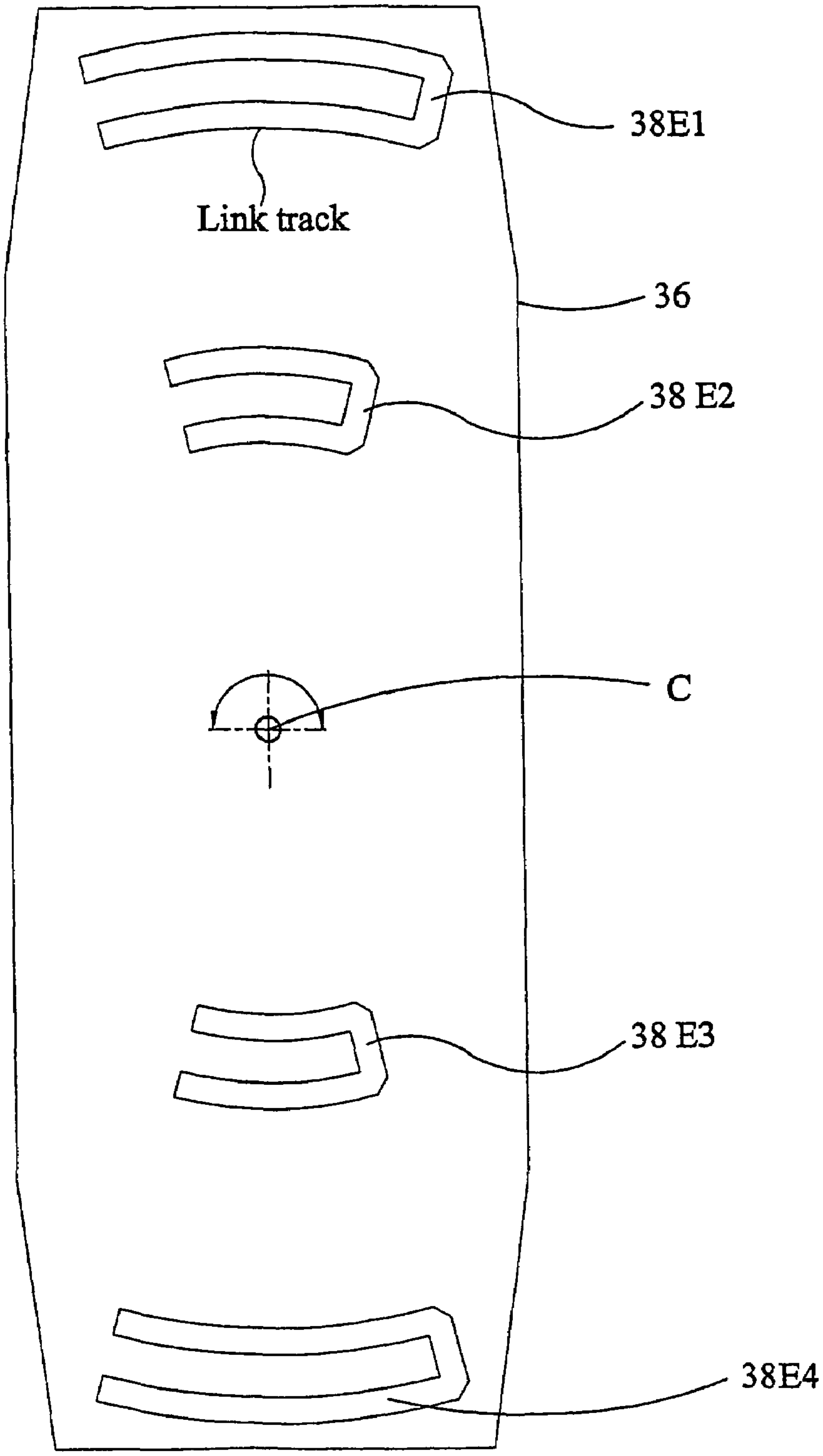
FIG. 7 shows a part of the apparatus of FIG. 6.

The apparatus also includes a second board 36, shown in outline in FIG. 6 but best illustrated in FIG. 7, which is pivotally or rotatably connected to the first board 32 at a point C, and is thus pivotal or rotatable about an axis of the board 32 through point C. The second board 36 has printed or otherwise disposed thereon four coupling links, each in the form of a respective U-shaped track 38E1–38E4 having arms which are arcuate and generally parallel. The second coupling link 38E2 is disposed radially inwardly of the first coupling link 38E1 corresponding to the relative positions of the track arrangements of the first and second devices on the first board 32. The third and fourth coupling links 38E3, 38E4 are disposed substantially symmetrically about the line of symmetry S relative to the first and second coupling links 38E1, 38E2.

In use, angular movement or rotation of the second board 36 relative to the first board 32 about pivot point C causes the coupling links 38E1–38E4 on the second board 36 to capacitively couple, to a greater or lesser extent, with the tracks 34*a*, 34*b* of the corresponding device on the first board 32, in the manner described with reference to the apparatus of FIG. 3. The amount or angular movement of the second board 36 relative to the first board 32 determines how far each coupling link extends over the respective conductive track and, hence, the amount of phase adjustment or delay which is applied to the signals on the transmission lines to each antenna element. In this manner, the phase of signals supplied on the transmission lines to all four of the antenna elements can be adjusted through movement of a single board 36.

It will be understood that rotation of the second board 36 in, for example, a clockwise direction with respect to the drawing will increase the effective length of the transmission lines connected to the first and second antenna elements E1, E2, but will reduce the effective length of the transmission lines connected to the elements E3, E4.

Furthermore, the increase in effective length of the transmission line to the first element E1 will be greater than that of the transmission line to the second element E2 owing to the greater initial length of the conductive tracks 34*a*E1, 34*b*E1 in the first device. Similarly, the decrease in effective length of the transmission line to the fourth element E4 will be greater than that of the transmission line to the third element E3.

In fact, in order to tilt the antenna whilst retaining maximum boresight gain and maximum suppression of the side lobes it is preferable to retain a linear phase front over most or all of the tilt range. In the preferred embodiment, therefore, delays of T, 2T, 3T and 4T, or relative equivalents thereof, are applied to the elements E1 to E4, by the respective phase adjustment device. In practice, this is achieved by ensuring that the radial positions of the tracks 34*a*, 34*b* of each device are separated by equal amounts.

Figure 8:
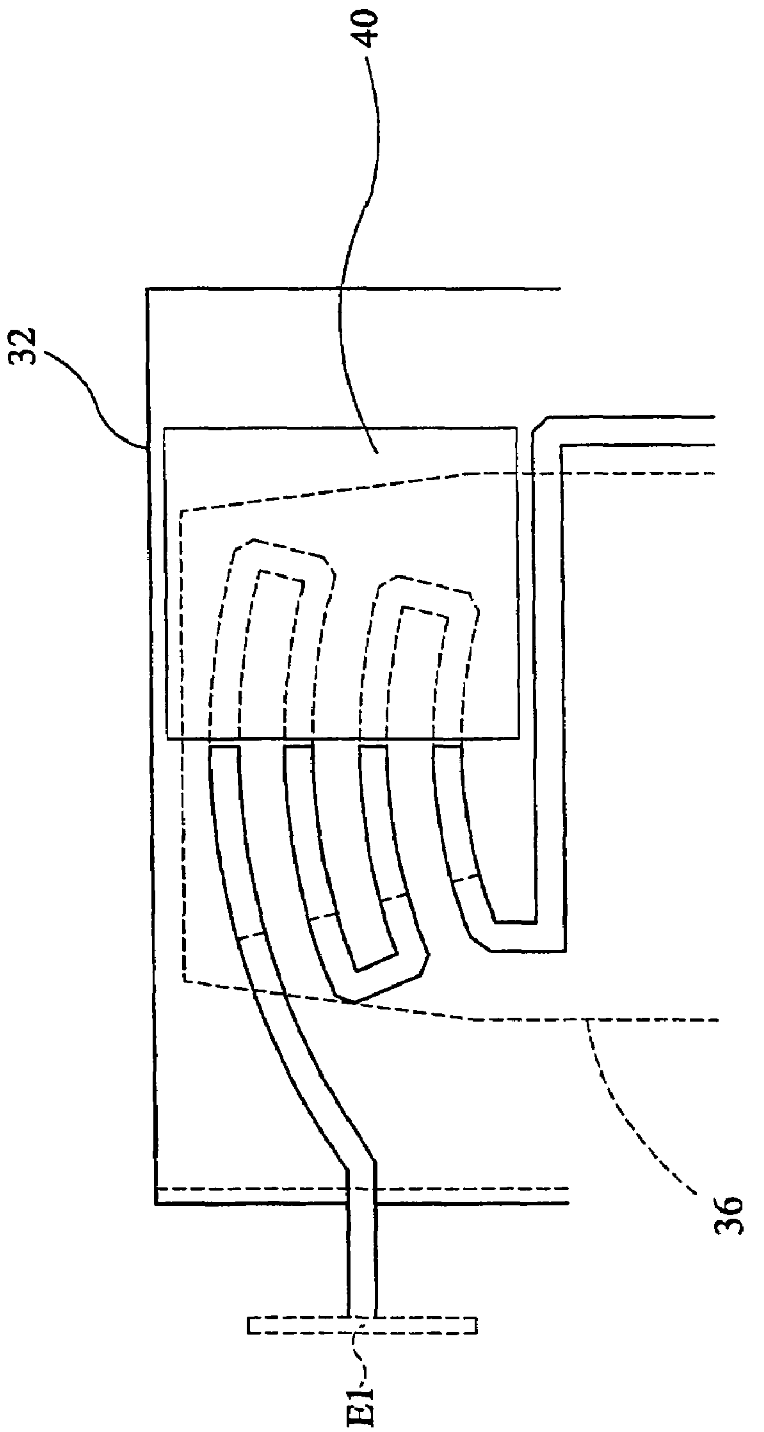
FIG. 8 shows a modification to the apparatus of FIG. 6.
Figure 9:
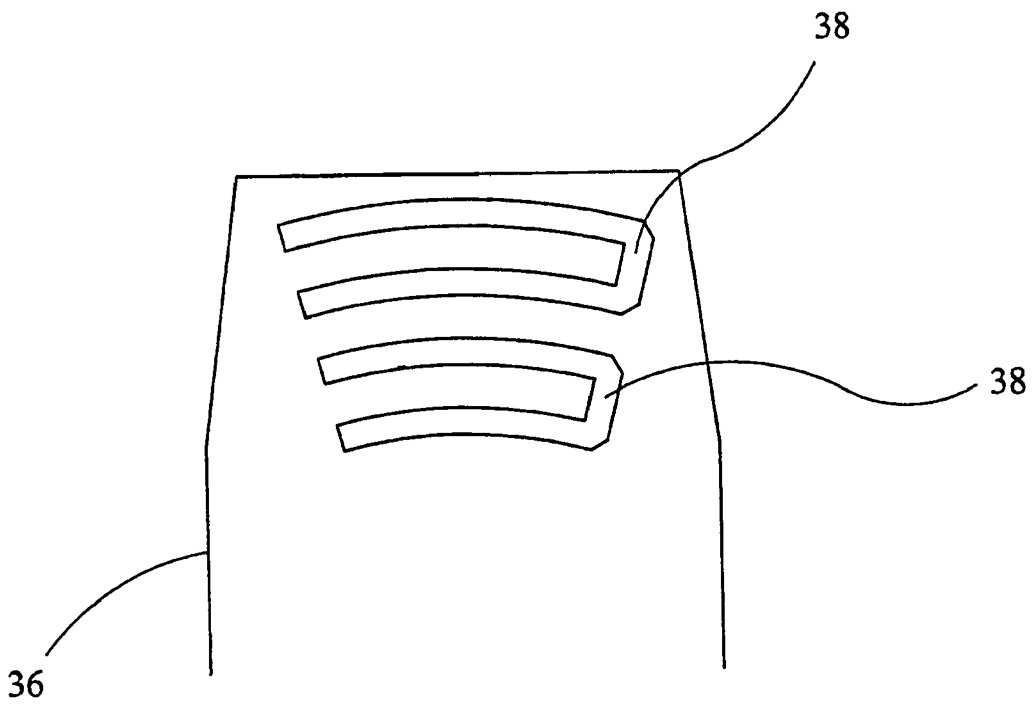
FIG. 9 shows a part of the apparatus of FIG. 8.

In a modification to the apparatus of FIG. 6, part of which is illustrated in FIG. 8, each phase adjustment device has a series arrangement of coupling links and tracks, as described with reference to FIG. 5, in order to increase the range of delay which can be applied to signals on the respective transmission line. In some applications, it may be desirable to have a series arrangement for some devices and a single arrangement for other devices. FIG. 9 illustrates the layout of the coupling links 38*a*, 38*b* on the second board 36 for a series arrangement of a single device.

Figure 10:
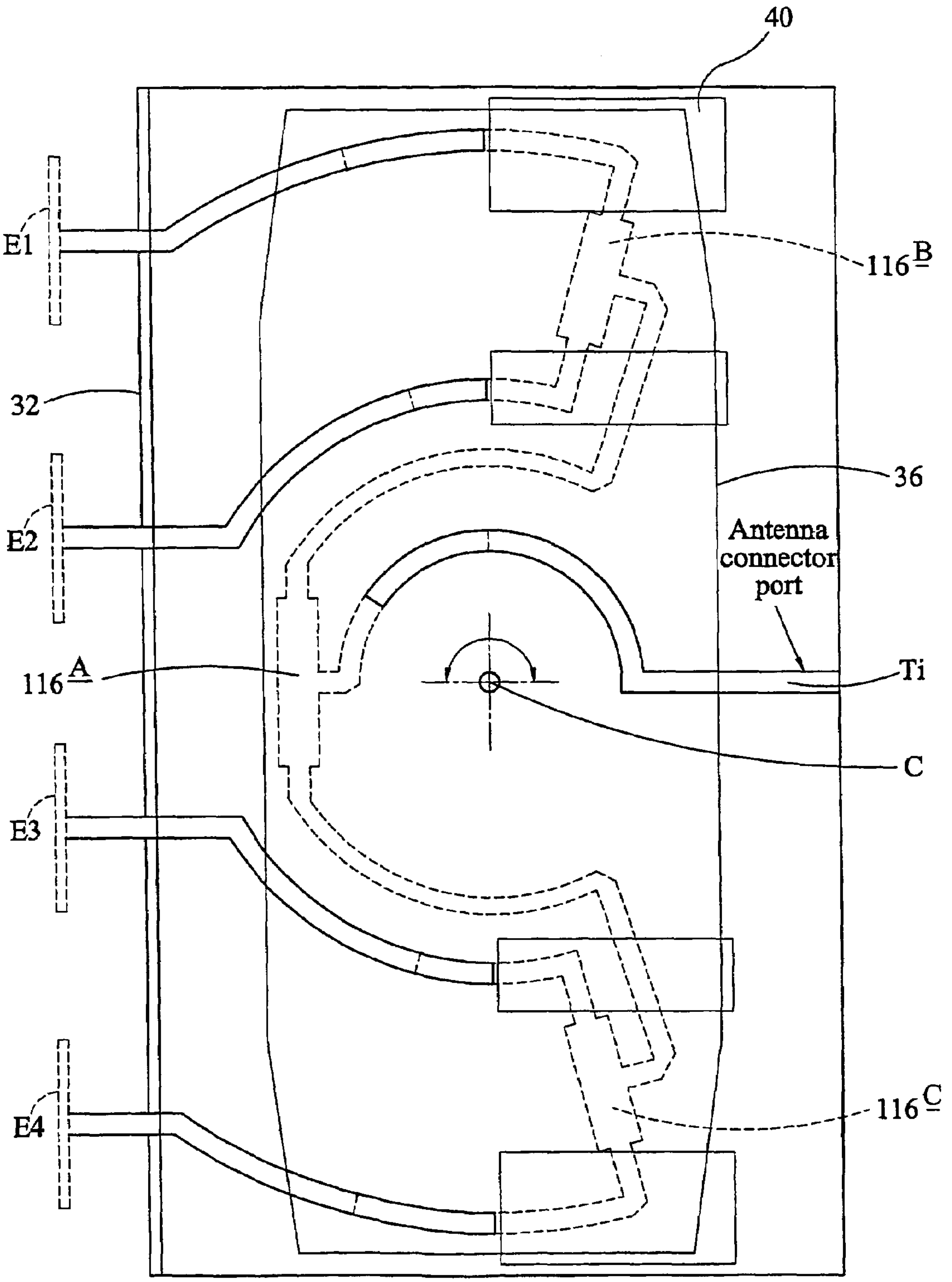
FIG. 10 is a schematic illustration of a third form of apparatus according to the invention.

In an alternative embodiment shown in FIG. 10, the signal distribution network comprising the splitters 116A, 116B, 116C are disposed on the second board 36 and connection between the antenna port or the splitter unit 116 (depending on the number of elements in the antenna) and the first splitter unit 116A is via a single conductive input track Ti and a capacitive link similar to those used in the phase adjustment devices on the first board 32.

Figure 11:
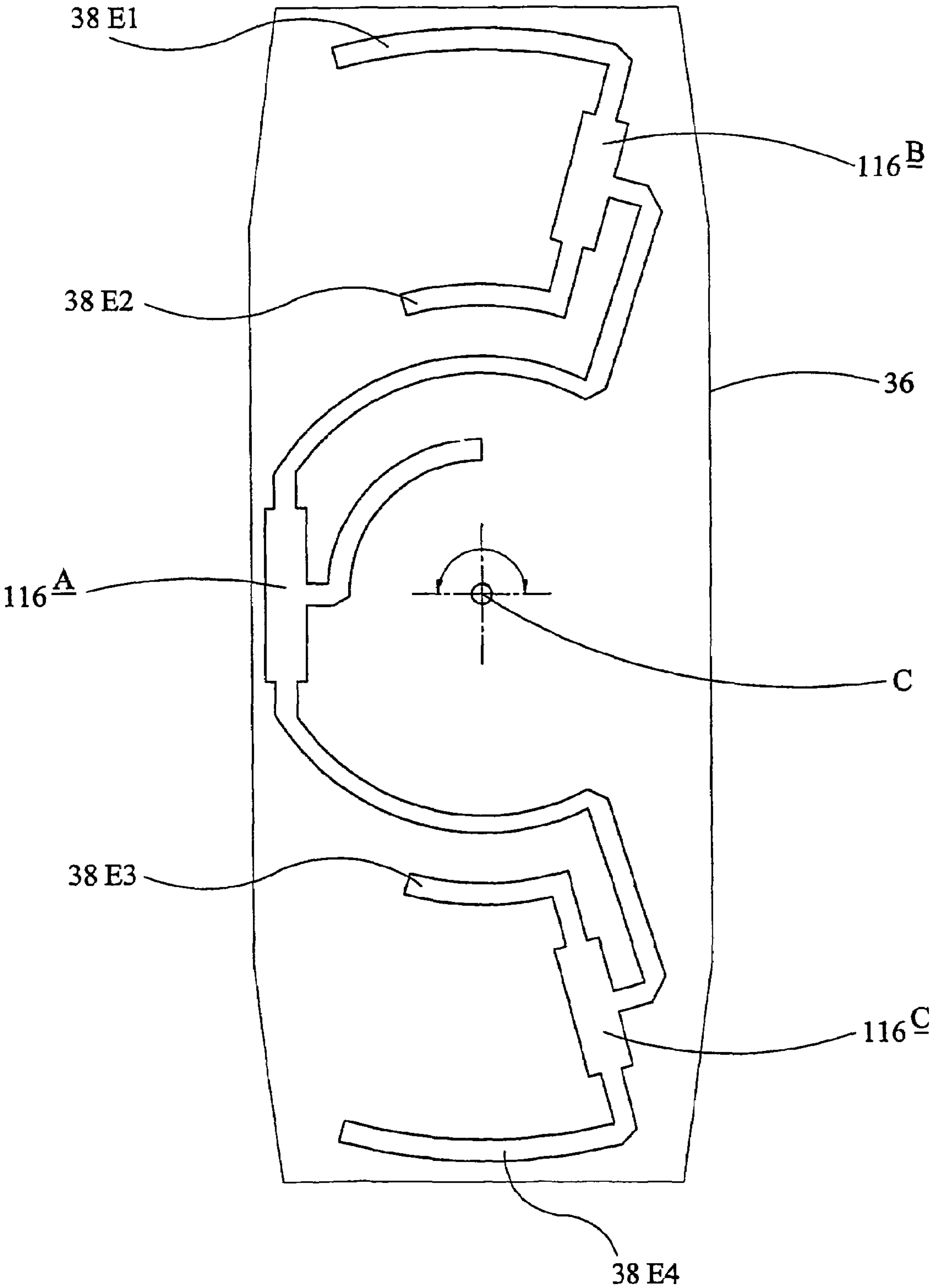
FIG. 11 shows a part of the apparatus of FIG. 10.

FIG. 11 illustrates more clearly the arrangement of conductive tracks and the splitter units on the second board 36. In this embodiment, each phase adjustment device has only a single length of conductive track disposed on the first board 32, rather than two parallel tracks as in the previously described embodiments. Similarly, the conductive link for each device comprises only a single, arcuate length of track rather than a U-shaped section of transmission line.

In use, the coupling link capacitively couples with the respective track in the same manner as described previously but, in this embodiment, a 10 mm movement of the second board 36 will produce an effective increase in length of the transmission line of 10 mm.

Figure 12:
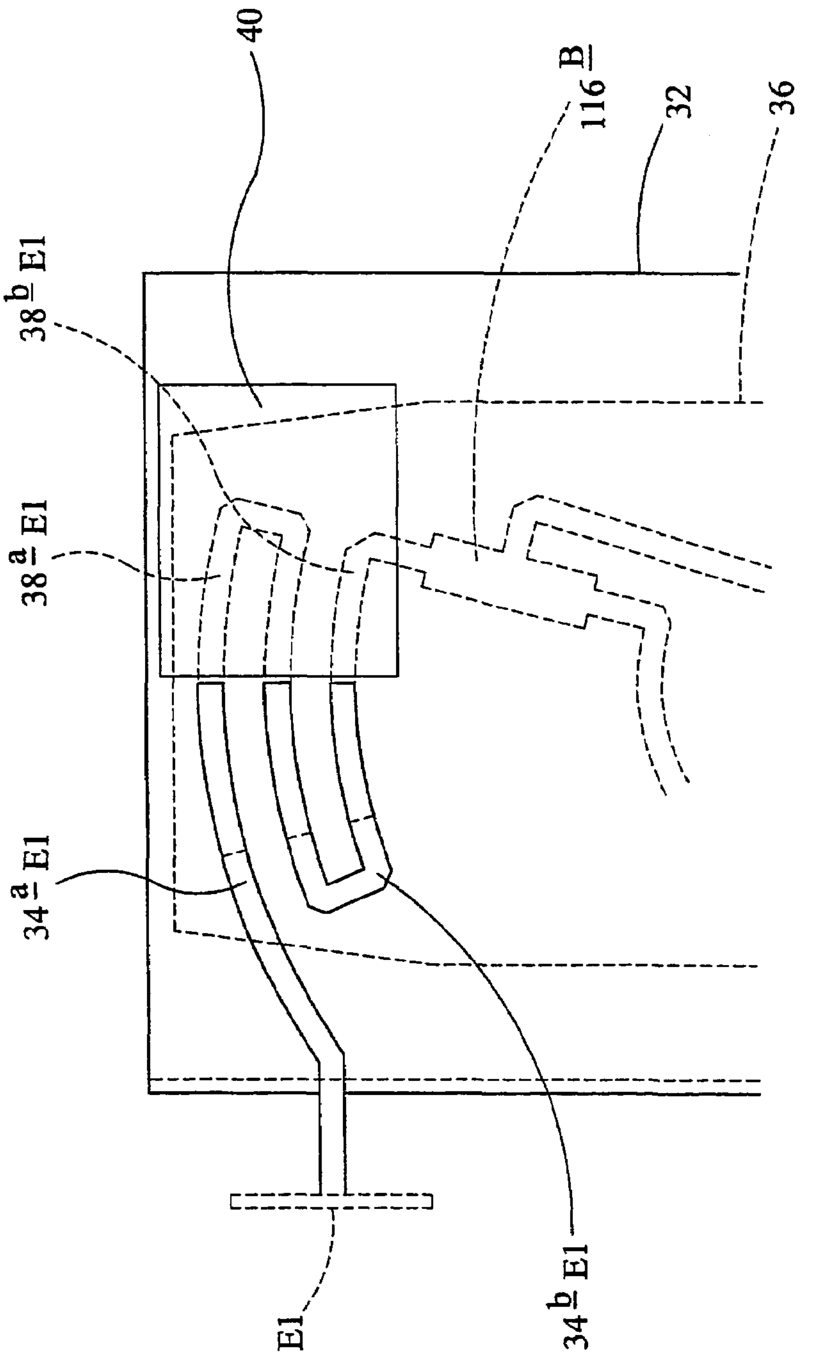
FIG. 12 shows a modification to the apparatus of FIG. 10.
Figure 13:
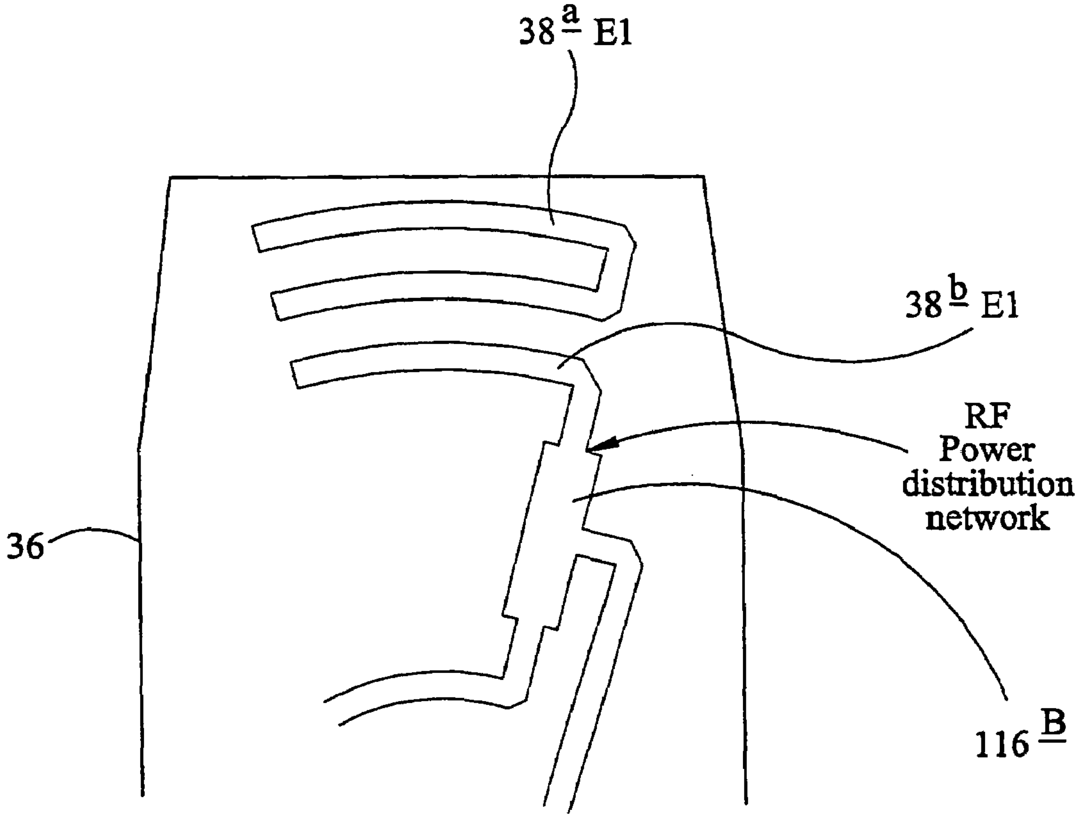
FIG. 13 shows a part of the apparatus of FIG. 12.

FIG. 12 illustrates a modification to the apparatus of FIGS. 10 and 11 in which each phase adjustment device includes an arrangement of tracks and coupling links which gives an effective increase in length of the transmission line of three times the distance moved by the second board 36. FIG. 13 illustrates the layout of the conductive tracks 38*a*E1, 38*b*E2 on the second board 36 for the FIG. 12 embodiment, said tracks forming the coupling link for a single device.

Figure 14:
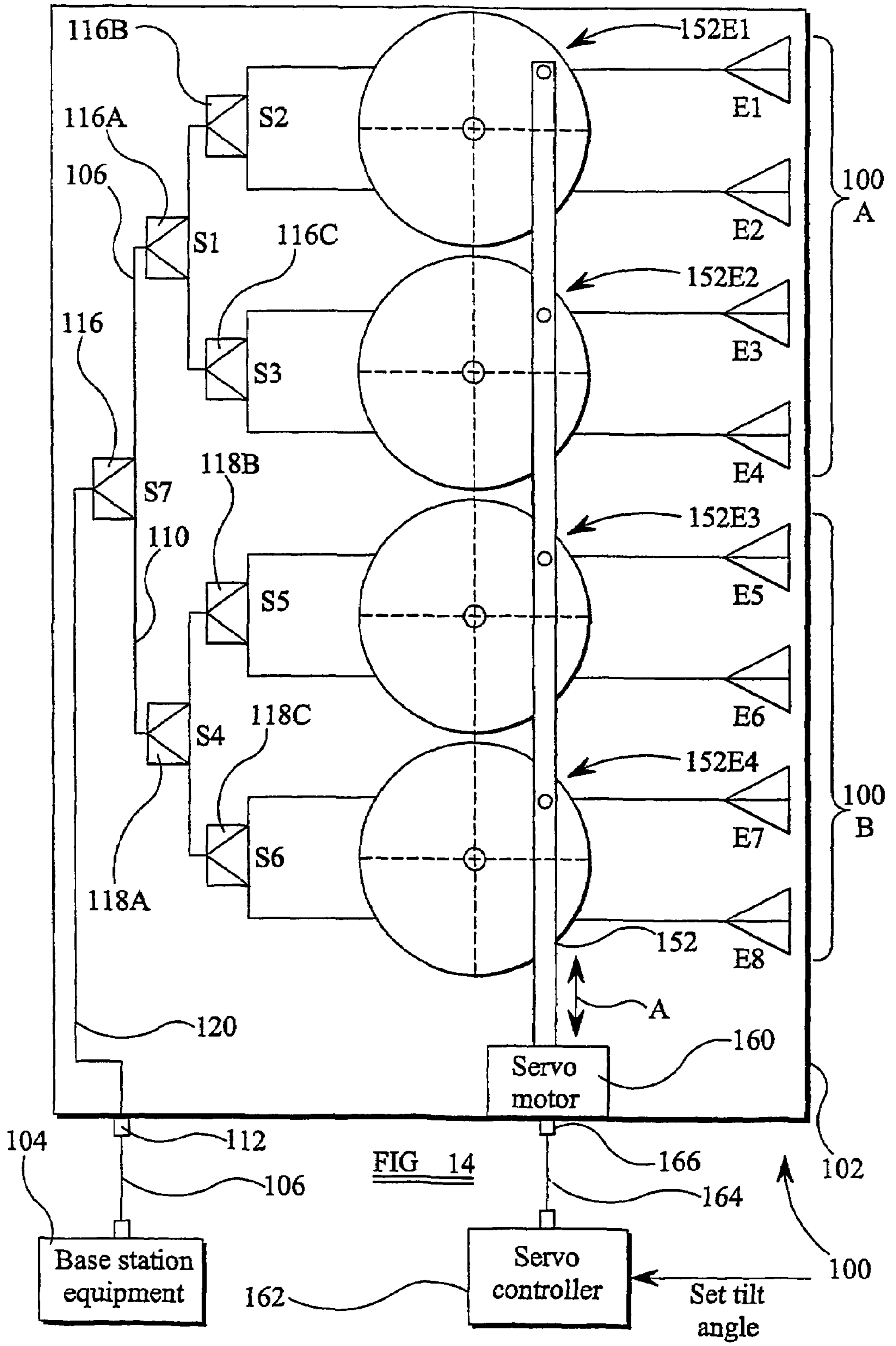
FIG. 14 is a schematic illustration of an antenna system incorporating an apparatus according to the invention.

Referring now to FIG. 14, this illustrates a phased array antenna system incorporating a number of apparatus according to the invention. In the embodiment shown in FIG. 14, each apparatus 152E1 to 152E4 is used to control the phase of signals supplied to two separate antenna elements. Thus each apparatus may be broadly similar to the apparatus shown in FIGS. 6 to 9 but having conductive track and coupling link arrangements for only two phase adjustment devices instead of four. The analogy and/or differences between the apparatus of FIG. 14 and the apparatus of FIGS. 6 to 9 will be fully understood by those skilled in the art.

In FIG. 14, angular movement of the second boards in the phase adjustment apparatus 152E1 to 152E4 (which are in the form of generally circular discs) is achieved by linear movement of an actuating arm 152. The actuating arm 152 is pivotally and eccentrically mounted to each of the discs in each apparatus. As in the embodiment of FIG. 2, movement of the actuating arm 152 in the directions shown by the arrow A is achieved by means of a servo motor 160 or the like. The servo motor 160 is again controlled by signals generated by a servo controller 162 and supplied to the servo motor 160 via a control cable 164 and a control port 166. The servo controller 162 may be located remote from the antenna assembly 102, for example in the base-station 104. The base station 104 may be located at the base of the antenna mast, or may be located several miles from the antenna mast if preferred.

It will be appreciated that such linear movement will result in the same angular movement applied to each disc. In order to retain maximum boresight gain and control of the side lobe levels, it may be necessary for each antenna element E1–E8 to have a different phase shift for a given extent of movement of the actuating arm 162. In this case the arrangements of conductive tracks and coupling links for each device may be slightly different (for example as in FIG. 10) in order to give the desired relationship between linear movement of the actuating arm 162 and phase shift of signals supplied to the elements.

Figure 15:
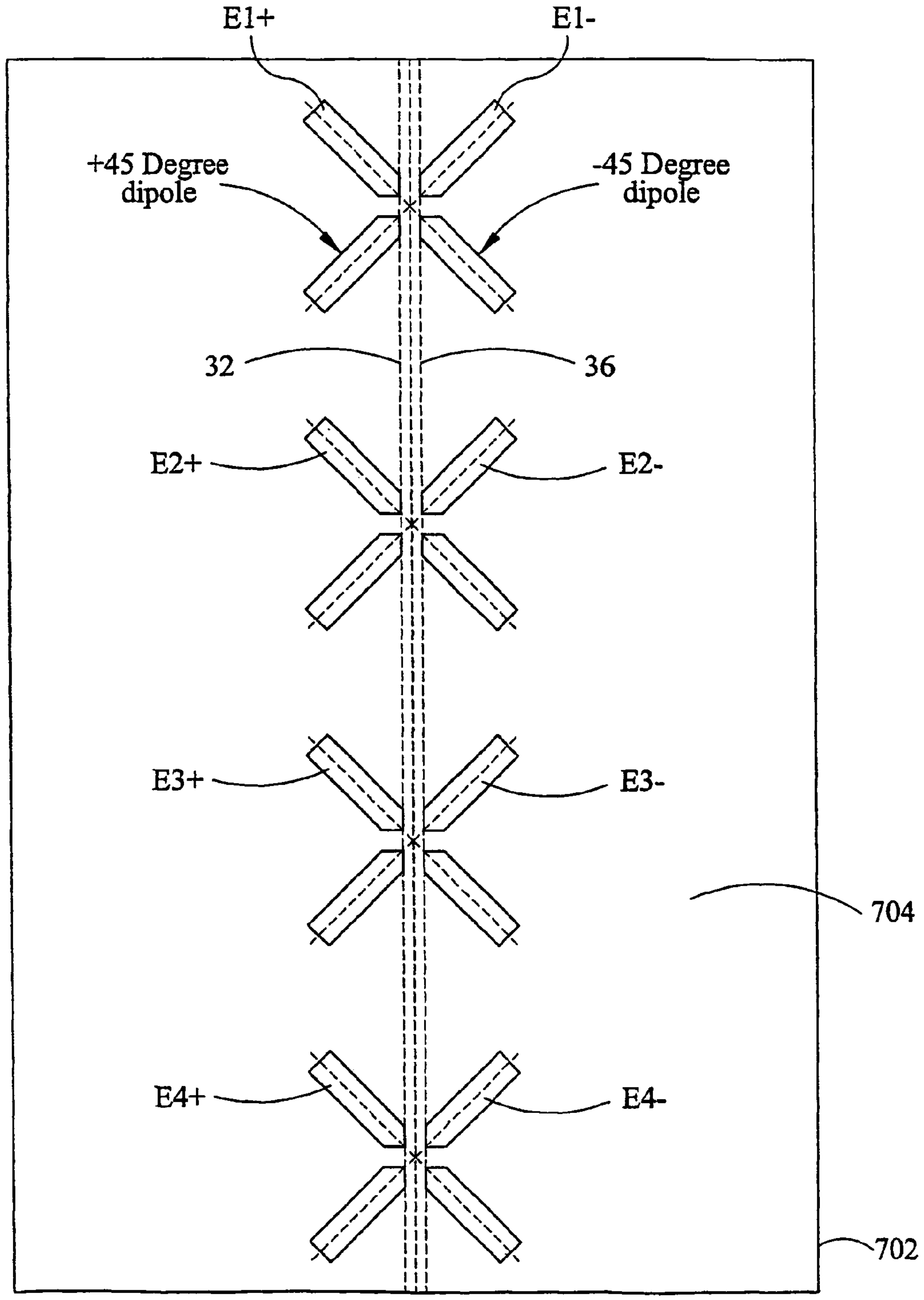
FIG. 15 illustrates use of the apparatus of the invention in a dual polarity antenna assembly.
Figure 16:
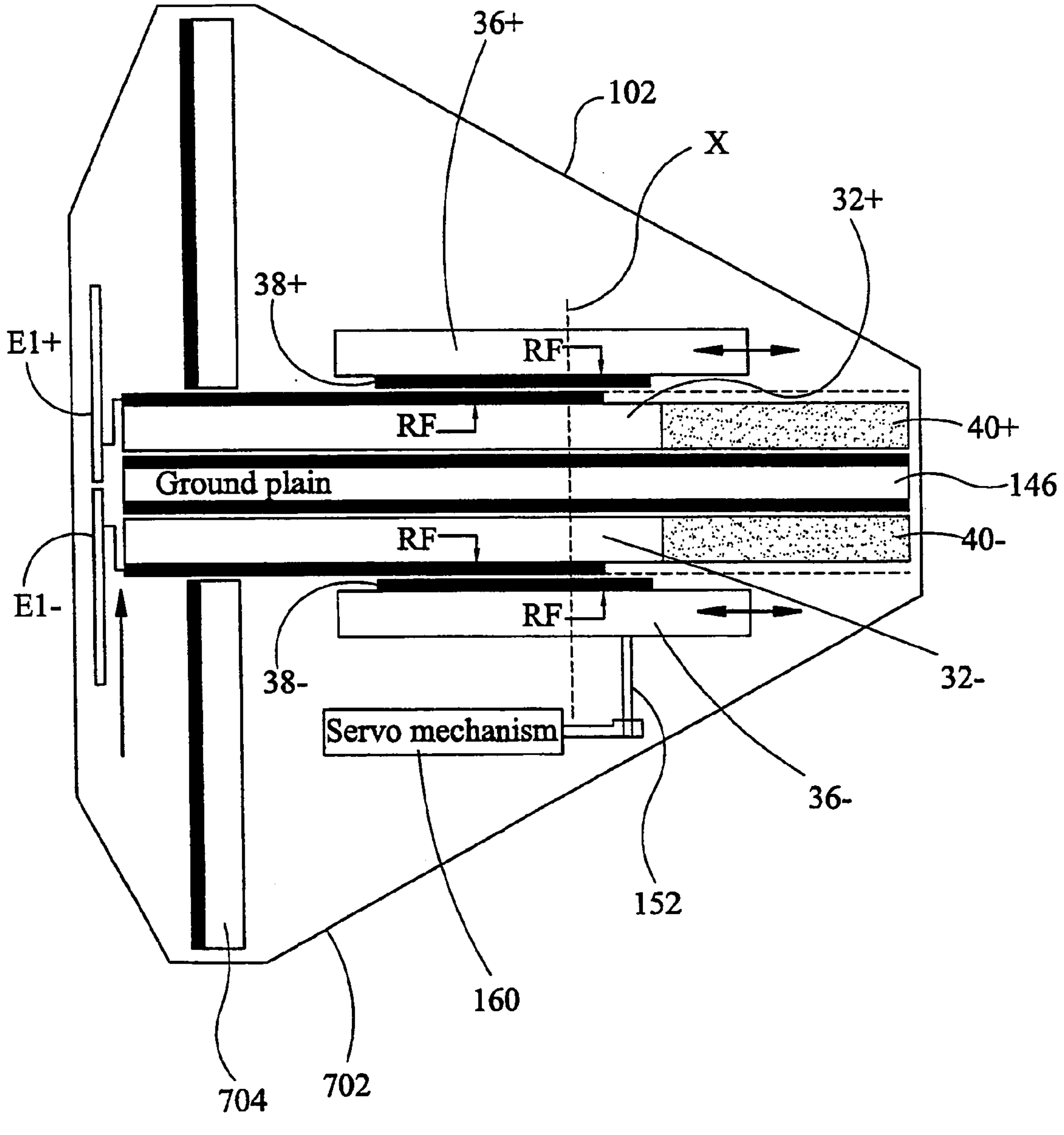
FIG. 16 is a cross section through a dual polarity antenna assembly incorporating the apparatus.

FIGS. 15 and 16 show a further embodiment and illustrate how the system of the present invention can be used with a dual-polarity antenna assembly. The use of dual polarity antenna assemblies is well known and common in telecommunication systems. FIG. 15 is a front view of a four element, dual polarity antenna 702 having crossed dipoles mounted above a reflecting backplane 704. The axis of rotation of the second board 36 is indicated by the dashed line X.

In this embodiment, the antenna assembly 702 consists of a stack of crossed dipole elements, one array of elements E1+ to E4+ angled at +45° to the vertical and the other array of elements E1− to E4− at −45° to the vertical. The arrays for each polarity are effectively electrically separate with signals from the base-station 104 being applied to individual signal distribution networks via separate input ports 112 (as in FIG. 2) to be supplied to each array.

Each array is thus provided with a respective separate phase adjustment apparatus, such as that described above with reference to FIGS. 6 to 13. However, both apparatus are adjustable by means of a common servo control motor, such as that described in relation to FIGS. 2 and 14, so that both arrays have the same angle of electrical tilt.

FIG. 15 shows the antenna assembly in plan view. The first phase adjustment apparatus connected to the antenna elements E1+ to E4+ in the positive polarity array comprises an arrangement as illustrated in and described with reference to FIGS. 3 and 4A. Specifically, the apparatus comprises a first board 32+ having conductive tracks 34*a*+, 34*b*+ printed or otherwise disposed thereon, a dielectric substrate 40+ disposed adjacent to the end of the first board 32+, and a second board 36+ having a U-shaped coupling link 38+ printed or otherwise disposed thereon.

The second phase adjustment apparatus connected to the antenna elements E1− to E4− in the negative polarity array comprises a similar arrangement to the first phase adjustment apparatus, which is mounted "back-to-back" with the first apparatus via an additional board 146 having a ground plane on each surface. The purpose of the additional board 146 and ground planes is described with reference to FIGS. 4A to 4D.

The second boards 36+, 36− are connected together via, and movable jointly by, a common shaft coupled to a servo mechanism, such as that described with reference to FIGS. 2 and 13. Movement of the second boards may be angular, as in the embodiments of FIGS. 6 to 12, or linear, as in the embodiments of FIGS. 3 to 5. It will be understood that the embodiments of FIGS. 3 to 5 may be extended to include two or more phase adjustment devices so that linear movement of a single, common second board 36 can adjust the phase of signals on two or more transmission lines.

It will be appreciated that the present invention provides for the independent phase shifting of individual elements within a phased array antenna system. The control of the phase of signals supplied to individual antenna elements allows an optimum VRP or beam pattern to be produced with maximum boresight gain and lower side lobe levels. The performance of such an antenna system is improved compared with existing systems.

Specifically, the invention provides a number of advantages over existing systems. For example, the use of a linearly or angularly movable board enables the correct amount of delay to be applied to the signals supplied to each antenna element, thereby to obtain maximum boresight gain and maximum suppression of the side lobes over the range of tilt angles of the antenna. Furthermore, this correct phase shift is achieved through movement of only a single antenna element, thus reducing cost and weight and improving reliability.

In addition, the invention may be implemented using a number of different constructions, such as micro-strip or tri-plate constructions, depending on requirements. Finally, the use of one more U-shaped coupling links together with the dielectric substrate 40 permits a large increase in effective length of the transmission line for a relatively small movement of the second board. The use of the dielectric substrate is entirely optional, to provide an additional delay effect, and can be used with any of the embodiments described above if desired.

It will be appreciated that the present invention is applicable to an assembly having any number of antenna elements (at least two) grouped into any number of sub-arrays, and including an assembly having a number, n, of antenna elements with one antenna element in each sub-array (i.e. n sub-arrays). It will also be appreciated that the system described previously is described as a system for transmitting signals but, additionally or alternatively, it may be operated as a receiver system.

Throughout the specification, a reference to "electrical tilt" shall be taken to mean adjustment of the radiation pattern transmitted and/or received from the antenna assembly without physically moving the antenna radome, or the antenna elements, but instead implemented by adjusting the phase of signals supplied to one or more of the antenna elements. It will be appreciated, however, that electrical tilt may be adjusted by an arrangement having both mechanical and electrical adjustment elements, as shown for example in FIG. 14. Furthermore, for the arrangement in FIG. 14, it will be appreciated that the adjustment of electrical tilt implemented by the mechanical phase adjustment arrangements 150E1–150E2 or 152E1–152E2 includes an electrical control means, in the form of the servo controller 162, such that the combined system may be referred to as "a system for adjusting the electrical tilt of an antenna system including a mechanical adjustment arrangement controlled by electrical means".

It will be appreciated that, although the antenna system of the present invention is described herein in terms of the transmitted VRP, in practice the system will preferably be adapted for operation in receive mode, whereby the antenna elements are arranged to receive signals, and such adaptation would be readily apparent to a person skilled in the art based on the preceding description.

The invention claimed is:

1. Apparatus for adjusting the phase of signals supplied to a plurality of antenna elements of an antenna, the apparatus comprising:

a) first supporting means;

b) a plurality of first transmission line parts disposed on the first supporting means;

c) second supporting means;

d) a plurality of second transmission line parts disposed on the second supporting means, each second transmission line part providing a respective capacitive coupling link for coupling together a respective pair of first transmission line parts to form a respective transmission line, the transmission lines being associated with respective antenna elements and having variable lengths to enable phase adjustment of antenna element signals;

e) means for moving the second supporting means relative to the first supporting means and providing a means for moving each coupling link along its respective pair of first transmission line parts to increase the length of a respective transmission line or to shorten the length of the respective transmission line to effect phase adjustment of antenna element signals, and f) a signal distribution network incorporating the transmission lines, the signal distribution network including splitting means and providing a means for connecting a single antenna port to each of the antenna elements.

2. Apparatus according to claim 1 wherein the first and second supporting means comprise board members on which the first and second transmission lines are printed respectively.

3. Apparatus according to claim 2 wherein the first supporting means has a first surface and a second, opposing surface, the transmission lines are disposed on the first surface and a conductive ground plane is disposed on the second, opposing surface.

4. Apparatus according to claim 2 including a dielectric separator arranged between the first and second supporting means to facilitate capacitive coupling therebetween.

5. Apparatus according to claim 1 wherein the first transmission line parts are arcuate with a common centre disposed between pairs thereof, and the means for moving the second supporting means relative to the first supporting means provides a means for rotating the second supporting means relative to the first supporting means about the common centre to effect both lengthening and shortening of first transmission lines.

6. Apparatus according to claim 1 further comprising a dielectric substrate disposed on the first supporting means such that movement of the second supporting means relative to the first supporting means causes a greater or lesser portion of one or more of the coupling links to extend over the dielectric substrate for further alteration of transmission line signal phase.

7. Apparatus according to claim 6 wherein the dielectric substrate is disposed on the first supporting means in a position adjacent to ends of first transmission line parts.

8. Apparatus according to claim 6 including a ground plane adjacent to the first supporting means.

9. Apparatus according to claim 6 including adjacent to the first supporting means a ground plane on a ground plane board member carrying the dielectric substrate and the first supporting means.

10. Apparatus according to claim 6 including a second ground plane board member having a second ground plane, wherein the second supporting means is disposed between the first supporting means and the second ground plane board member.

11. Apparatus according to claim 1 wherein the coupling links are U-shaped.

12. Apparatus according to claim 1 wherein each first transmission line part is arcuate.

13. Apparatus according to claim 12 wherein the first transmission line parts are arcuate with a common centre, and the means for moving the second supporting means relative to the first supporting means provides a means for rotating the second supporting means relative to the first supporting means about the common centre and for moving each coupling link along its respective pair of first transmission line parts.

14. Apparatus according to claim 1 wherein the transmission lines and coupling links comprise a means providing for movement of the second supporting means relative to the first supporting means to adjust phase of a signal supplied to an antenna element by an amount different to phase of a signal supplied to another antenna element.

15. Apparatus according to claim 1 including actuating means coupled to the second supporting means for effecting movement thereof relative to the first supporting means.

16. Apparatus according to claim 15 wherein the actuating means comprises an actuating arm driven by a servo control arrangement.

17. Apparatus according to claim 1 incorporating the said plurality of antenna elements and providing a means for adjusting signal phase therefore.

18. Apparatus according to claim 1 wherein:

g) each transmission line extends via a respective plurality of pairs of first transmission line parts;

h) each second transmission line part provides respective capacitative coupling links for coupling respective pairs of first transmission line parts; and i) the means for moving the second supporting means relative to the first supporting means provides a means for moving each coupling link along a respective pair of first transmission line parts to change the length of the respective first transmission line for phase adjustment of an associated antenna element signal.

19. Apparatus for adjusting the phase of signals supplied to a plurality of antenna elements of an antenna, the apparatus comprising:

a) first supporting means;

b) a plurality of first transmission line parts disposed on the first supporting means;

c) second supporting means;

d) a plurality of second transmission line parts disposed on the second supporting means, each second transmission line part providing a respective capacitive coupling link for coupling together a respective pair of first transmission line parts to form a respective transmission line, the transmission lines being associated with respective antenna elements and having variable lengths to enable phase adjustment of antenna element signals;

e) means for moving the second supporting means relative to the first supporting means and providing a means for moving each coupling link along its respective pair of first transmission line parts to increase the length of a respective transmission line or to shorten the length of the respective transmission line to effect phase adjustment of antenna element signals;

f) a signal distribution network incorporating the transmission lines, the signal distribution network including splitting means and providing a means for connecting a single antenna port to each of the antenna elements; and g) a dielectric substrate disposed on the first supporting means and comprising a means providing for movement of the second supporting means relative to the first supporting means to cause a greater or lesser portion of one or more of the coupling links to extend over the dielectric substrate and to alter signal phase in the transmission lines.

20. Apparatus according to claim 19 wherein the dielectric substrate is disposed on the first supporting means adjacent to ends of first transmission line parts.

21. Apparatus according to claim 19 wherein the first and second supporting means are first and second board members on which respectively the transmission lines and coupling links are printed.

22. Apparatus according to claim 21 wherein the means for moving the second supporting means relative to the first supporting means provides a means for rotating the second board member relative to the first board member.

23. Apparatus according to claim 21 including a ground plane adjacent to the first board member.

24. Apparatus according to claim 21 including a ground plane adjacent to the first board member and disposed on a ground plane board member carrying the dielectric substrate and the first board member.

25. Apparatus according to claim 21 including a second ground plane board member having a second ground plane, and the second board member is disposed between the first board member and the second ground plane board member.

26. Apparatus according to claim 21 wherein the first transmission lines are disposed on a first surface of the first board member and a conductive ground plane is disposed on a second, opposing surface of the first board member.

27. Apparatus according to claim 19 including a dielectric separator arranged between the first and second supporting means to facilitate capacitive coupling therebetween.

28. Apparatus according to claim 19 wherein the coupling links comprise U-shaped lengths of second transmission line.

29. Apparatus according to claim 19 wherein each first transmission line part is arcuate.

30. Apparatus according to claim 29 wherein first transmission line parts are arcuate with a common center, and the means for moving the second supporting means relative to the first supporting means provides a means for rotating the second supporting means relative to the first supporting means about the common centre and for moving each coupling link along its respective pair of first transmission line parts.

31. Apparatus according to claim 19 wherein the first and second transmission line parts comprise a means providing for movement of the second supporting means relative to the first supporting means to adjust signal phase supplied to an antenna element by an amount different from that supplied to another antenna element.

32. Apparatus according to claim 19 including actuating means coupled to the second supporting means for effecting movement thereof relative to the first supporting means.

33. Apparatus according to claim 32 wherein the actuating means comprises an actuating arm driven by a servo control arrangement.

34. Apparatus according to claim 19 incorporating the said plurality of antenna elements and providing a means for adjusting signal phase therefor.

35. Apparatus according to claim 19 wherein:

j) each transmission line incorporates a respective plurality of pairs of first transmission line parts;

k) each second transmission line part provides respective capacitative coupling links for coupling respective pairs of first transmission line parts; and l) the means for moving the second supporting means relative to the first supporting means provides a means for moving each coupling link along its respective pair of first transmission line parts to change the length of the respective transmission line for phase adjustment of an associated antenna element signal.

* * * * *